US012782830B2

(12) United States Patent
Tan et al.

(10) Patent No.: US 12,782,830 B2
(45) Date of Patent: Nov. 3, 2026

(54) SPATIALLY-VARYING SPECTRAL METROLOGY FOR LOCAL VARIATION DETECTION

(71) Applicant: KLA Corporation, Milpitas, CA (US)

(72) Inventors: Zhengquan Tan, Cupertino, CA (US); Houssam Chouaib, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 118 days.

(21) Appl. No.: 18/793,570

(22) Filed: Aug. 2, 2024

(65) Prior Publication Data

US 2025/0053098 A1 Feb. 13, 2025

Related U.S. Application Data

(60) Provisional application No. 63/599,566, filed on Nov. 16, 2023, provisional application No. 63/543,945, filed on Oct. 13, 2023, provisional application No. 63/531,816, filed on Aug. 10, 2023.

(51) Int. Cl.
*G03F 7/00* (2006.01)

(52) U.S. Cl.
CPC .... *G03F 7/706849* (2023.05); *G03F 7/70608* (2013.01); *G03F 7/706851* (2023.05)

(58) Field of Classification Search
CPC ............. G03F 7/70608; G03F 7/70625; G03F 7/706849; G03F 7/706851; B65D 25/40; B65D 43/16; B65D 47/08; B65D 47/088; B65D 47/26; B65D 51/24; B65D 51/28; B65D 81/32
See application file for complete search history.

(56) References Cited

U.S. PATENT DOCUMENTS

| | | | |
|---|---|---|---|
| 6,573,997 | B1 | 6/2003 | Goldberg et al. |
| 6,690,473 | B1 | 2/2004 | Stanke et al. |
| 6,856,384 | B1 | 2/2005 | Rovira |
| 7,369,251 | B2 | 5/2008 | Rosakis et al. |

(Continued)

OTHER PUBLICATIONS

Korean Intellectual Property Office, International Search Report and Written Opinion received in International Application No. PCT/US2024/041408, Nov. 20, 2024, 7 pages.

(Continued)

*Primary Examiner* — Deoram Persaud
(74) *Attorney, Agent, or Firm* — Suiter Swantz IP

(57) ABSTRACT

A metrology system may include a light source to generate an illumination beam and a spectral metrology sub-system configured to direct the illumination beam to a sample and collect sample light from the sample. The spectral metrology sub-system may include illumination optics with at least one of an illumination polarizer or an illumination compensator, and collection optics with at least one of a collection polarizer or a collection compensator. The metrology system may include a shearing grating to shear the sample light from the collection optics into two sheared beams, and a spectrometer to generate measurement data of the sample on a multi-pixel detector based on the two sheared beams, where the measurement data is both spectrally resolved and has spatially varying components on a length scale smaller than a spot size of the illumination beam. The system may further generate metrology measurements based on the measurement data.

25 Claims, 16 Drawing Sheets

(56) References Cited

U.S. PATENT DOCUMENTS

| | | | | | |
|---|---|---|---|---|---|
| 7,538,891 | B1 | 5/2009 | Mello et al. | | |
| 7,768,653 | B2 | 8/2010 | Latypov et al. | | |
| 7,826,071 | B2 * | 11/2010 | Shchegrov | G01N 21/47 | 356/625 |
| 7,933,026 | B2 * | 4/2011 | Opsal | G01B 11/0641 | 356/369 |
| 9,170,498 | B2 | 10/2015 | Van De Kerkhof et al. | | |
| 9,863,756 | B1 | 1/2018 | Li | | |
| 10,101,670 | B2 | 10/2018 | Pandev et al. | | |
| 10,365,163 | B2 | 7/2019 | Barak et al. | | |
| 10,473,452 | B2 | 11/2019 | Perea et al. | | |
| 10,502,694 | B2 | 12/2019 | Dziura et al. | | |
| 10,769,320 | B2 | 9/2020 | Kuznetsov et al. | | |
| 11,009,336 | B2 | 5/2021 | Lu et al. | | |
| 11,262,293 | B2 | 3/2022 | Rapaport et al. | | |
| 11,340,118 | B2 | 5/2022 | Lu et al. | | |
| 11,609,506 | B2 | 3/2023 | Mengel | | |
| 12,209,854 | B2 * | 1/2025 | Pandev | G03F 7/70633 | |
| 2003/0211402 | A1 | 11/2003 | Hill | | |
| 2004/0257587 | A1 | 12/2004 | Rosakis et al. | | |
| 2008/0043233 | A1 * | 2/2008 | Snabre | G01N 15/0227 | 356/336 |
| 2010/0141959 | A1 * | 6/2010 | Kuchel | G01J 9/0215 | 356/521 |
| 2013/0114085 | A1 * | 5/2013 | Wang | G01N 21/211 | 356/445 |
| 2014/0252240 | A1 * | 9/2014 | Baker | G01N 23/00 | 250/390.12 |
| 2016/0141193 | A1 * | 5/2016 | Pandev | G06N 20/00 | 702/81 |
| 2022/0342325 | A1 | 10/2022 | Mengel | | |
| 2025/0012734 | A1 | 1/2025 | Tan et al. | | |
| 2025/0050447 | A1 * | 2/2025 | Buller | B22F 10/28 | |
| 2025/0052666 | A1 * | 2/2025 | Chang | G01N 21/211 | |

OTHER PUBLICATIONS

U.S. Appl. No. 18/743,118, filed Jun. 14, 2024, KLA Corporation.

Jennewein et al., "Interferometrical Profilometry at Surfaces with Varying Materials," SPIE Conference on Metrology, Inspection, and Process Control for Microlithography XIII, Jun. 14, 1999, 8 pages.

Kudla et al., "Determination of the optical properties of thin absorbing layers with spectroscopic ellipsometry and interferometric microscopy," Proceedings of SPIE, vol. 5858, Aug. 29, 2005, 9 pages.

* cited by examiner

SPATIALLY-VARYING SPECTRAL METROLOGY FOR LOCAL VARIATION DETECTION

CROSS-REFERENCE TO RELATED APPLICATION

The present application claims the benefit under 35 U.S.C. § 119 (e) of U.S. Provisional Application Ser. No. 63/599,566 filed on Nov. 16, 2023, U.S. Provisional Application Ser. No. 63/543,945 filed on Oct. 13, 2023, and U.S. Provisional Application Ser. No. 63/531,816 filed on Aug. 10, 2023; all of which are incorporated herein by reference in their entireties.

TECHNICAL FIELD

The present disclosure relates generally to ellipsometry metrology and, more particularly, to spatially-resolved ellipsometry metrology.

BACKGROUND

Sub-10 nm critical dimensions processes require the use of extreme ultraviolet lithography and/or multi patterning techniques. The error budget caused by the exposure tool, the mask, the substrate, wafer process, and reticle are getting tighter.

Existing metrology techniques such as spectral ellipsometry provide measurement areas on the order of tens of micrometers. When used to characterize structures smaller than the spot size such that multiple structures are simultaneously illuminated, the measurements represent an average of the illuminated structures. However, it may be desirable to characterize spatial scales smaller than the achievable spot sizes.

There is therefore a need to develop systems and methods to provide systems and methods to cure the above deficiencies.

SUMMARY

In embodiments, the techniques described herein relate to a metrology system including a light source configured to generate an illumination beam; a spectral metrology sub-system configured to direct the illumination beam to a sample and collect sample light from the sample in response to the illumination beam, where the spectral metrology sub-system includes one or more illumination optics including at least one of an illumination polarizer or an illumination compensator; and one or more collection optics including at least one of a collection polarizer or a collection compensator; a shearing grating configured to shear the sample light from the one or more collection optics into two sheared beams; a spectrometer configured to generate measurement data of the sample on a multi-pixel detector based on the two sheared beams, where the measurement data is spectrally resolved along one direction on the multi-pixel detector and has spatially varying components along an orthogonal direction on a length scale smaller than a spot size of the illumination beam on the sample; and a controller including one or more processors configured to execute program instructions causing the one or more processors to implement a metrology recipe by generating one or more spatially-varying metrology measurements of the sample based on the measurement data associated with one or more configurations of the spectral metrology sub-system.

In embodiments, the techniques described herein relate to a metrology system, where the measurement data is spatially varying as a function of light path distance (LPD) along the orthogonal direction of the multi-pixel detector.

In embodiments, the techniques described herein relate to a metrology system, further including a lens to generate an image of the sample on an entrance slit of the spectrometer based on interfering the two sheared beams, where the measurement data is spatially resolved along the orthogonal direction of the multi-pixel detector.

In embodiments, the techniques described herein relate to a metrology system, where the spectral metrology sub-system is a single-pass sub-system, where the sample light is associated with reflection of the illumination beam by the sample.

In embodiments, the techniques described herein relate to a metrology system, where the spectral metrology sub-system is a multi-pass sub-system, where the spectral metrology sub-system further includes one or more mirrors configured to redirect the sample light to a common location of the sample for one or more repeated interactions prior to the one or more collection optics.

In embodiments, the techniques described herein relate to a metrology system, where the one or more mirrors include a first mirror configured to reflect sample light associated with a first interaction of the illumination beam with the common location of the sample to a modulating target as a first interaction; and a second mirror configured to reflect sample light from the modulating target to the common location of the sample as a second interaction, where the one or more collection optics receive the sample light from the common location of the sample associated with the second interaction.

In embodiments, the techniques described herein relate to a metrology system, where the spectral metrology sub-system is a multi-pass sub-system, where the spectral metrology sub-system further includes one or more mirrors configured to redirect the sample light to a series of locations on the sample prior to the one or more collection optics.

In embodiments, the techniques described herein relate to a metrology system, where the series of locations on the sample have features of a common design.

In embodiments, the techniques described herein relate to a metrology system, where the one or more configurations of the spectral metrology sub-system include one or more rotational positions of elements in at least one of the one or more illumination optics or the one or more collection optics.

In embodiments, the techniques described herein relate to a metrology system, where the one or more configurations of the spectral metrology sub-system include one or more incidence angles of the illumination beam on the sample.

In embodiments, the techniques described herein relate to a metrology system, where the one or more incidence angles include at least one of one or more azimuth incidence angles or one or more polar incidence angles.

In embodiments, the techniques described herein relate to a metrology system, where the spectral metrology sub-system operates as a spectral ellipsometry system.

In embodiments, the techniques described herein relate to a metrology system, where the spectral metrology sub-system operates as a spectral reflectometry system.

In embodiments, the techniques described herein relate to a metrology system, where the one or more spatially-varying metrology measurements include at least one of an overlay measurement, a tilt measurement, a critical dimension measurement, or an edge roughness measurement.

In embodiments, the techniques described herein relate to a metrology system, where the one or more spatially-varying metrology measurements include two or more spatially-varying metrology measurements.

In embodiments, the techniques described herein relate to a metrology system, where the two or more spatially-varying metrology measurements include at least a critical dimension measurement and an edge roughness measurement.

In embodiments, the techniques described herein relate to a metrology method including illuminating a sample with an illumination beam though one or more illumination optics including at least one of an illumination polarizer or an illumination compensator; collecting sample light generated in response to the illumination beam from the sample through one or more collection optics including at least one of a collection polarizer or a collection compensator; shearing the sample light from the one or more collection optics into two sheared beams; generating measurement data of the sample on a multi-pixel detector through a spectrometer, where the measurement data is spectrally resolved along one direction of the multi-pixel detector and has spatially varying components along an orthogonal direction of the multi-pixel detector, where the spatially varying components vary on a length scale smaller than a spot size of the illumination beam on the sample; and generating one or more spatially-varying metrology measurements of the sample based on the measurement data associated with one or more configurations of the one or more illumination optics and the one or more collection optics.

In embodiments, the techniques described herein relate to a metrology method, where the measurement data is spatially varying as a function of light path distance (LPD) along the orthogonal direction of the multi-pixel detector.

In embodiments, the techniques described herein relate to a metrology method, further including imaging of the sample on an entrance slit of the spectrometer with a lens based on interfering the two sheared beams, where the measurement data is spatially resolved along the orthogonal direction of the multi-pixel detector.

In embodiments, the techniques described herein relate to a metrology system including a controller including one or more processors configured to execute program instructions causing the one or more processors to implement a metrology recipe by receiving measurement data of a sample associated with one or more configurations of a spectral metrology sub-system, where the measurement data is generated by illuminating the sample with an illumination beam though one or more illumination optics including at least one of an illumination polarizer or an illumination compensator; collecting sample light generated in response to the illumination beam from the sample through one or more collection optics including at least one of a collection polarizer or a collection compensator; shearing the sample light from the one or more collection optics into two sheared beams; and generating measurement data of the sample on a multi-pixel detector through a spectrometer; and generating one or more spatially-varying metrology measurements of the sample based on the measurement data associated with the one or more configurations of the spectral metrology sub-system.

In embodiments, the techniques described herein relate to a metrology system, where the measurement data is spatially varying as a function of light path distance (LPD).

In embodiments, the techniques described herein relate to a metrology system, further including a lens to generate an image of the sample on an entrance slit of the spectrometer based on interfering the two sheared beams, where the measurement data is spatially resolved.

In embodiments, the techniques described herein relate to a metrology system, where the one or more spatially-varying metrology measurements include at least one of an overlay measurement, a tilt measurement, a critical dimension measurement, or an edge roughness measurement.

In embodiments, the techniques described herein relate to a metrology system, where the one or more spatially-varying metrology measurements include two or more spatially-varying metrology measurements.

In embodiments, the techniques described herein relate to a metrology system, where the two or more spatially-varying metrology measurements include at least a critical dimension measurement and an edge roughness measurement.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1:
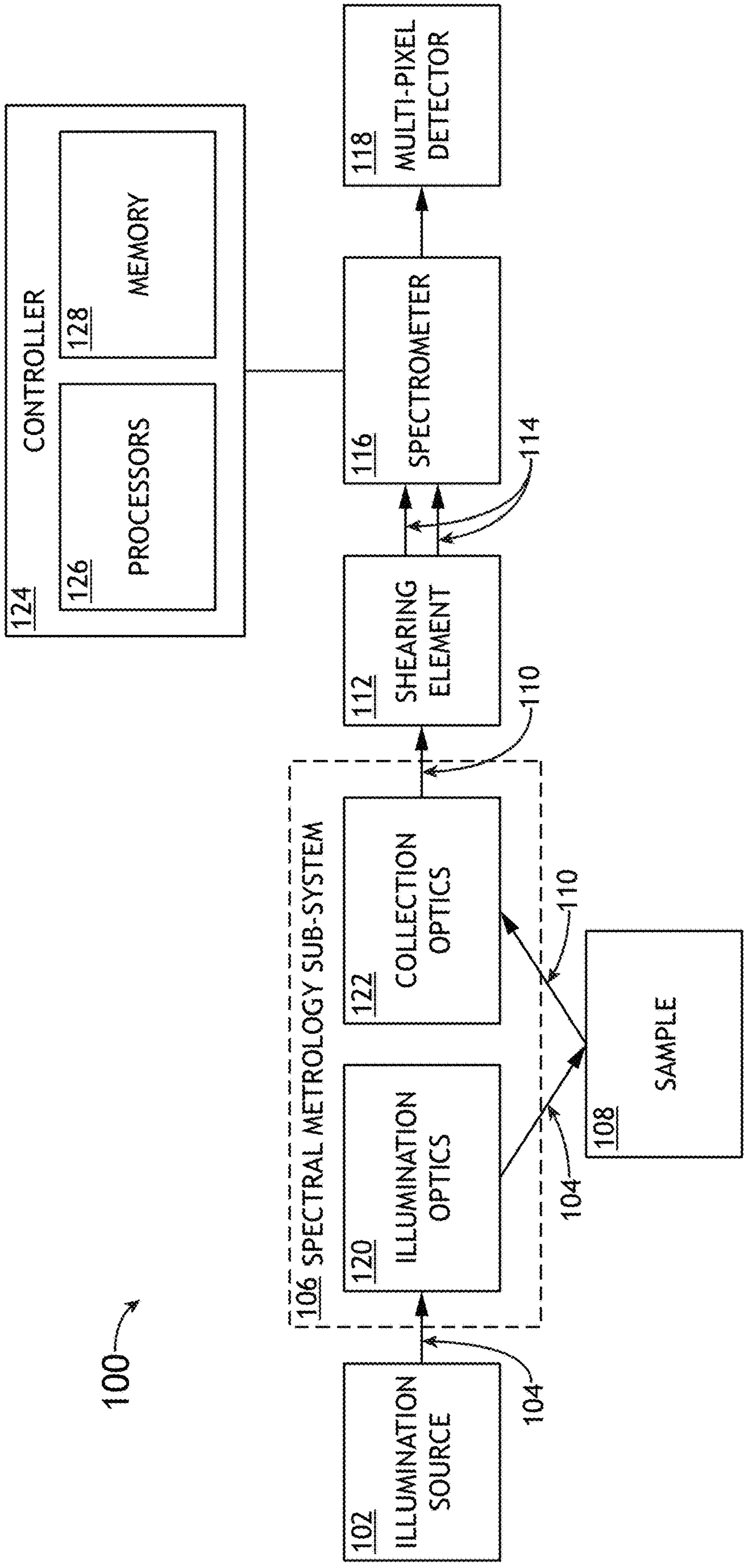
FIG. 1 illustrates a block diagram view of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods providing accurate spectral metrology (e.g., spectral ellipsometry, or the like) with high spatial accuracy based on a combination of spectral metrology with shearing interferometry.

In some embodiments, a metrology system includes a shearing interferometer in a collection arm of a spectral ellipsometer to provide spatially-sensitive measurements within a measurement area associated with a spot size of an illumination beam on a sample. For example, the metrology system may include a spectral metrology sub-system with illumination and collection optics for control of the polarization and/or phase of incident illumination and collected sample light (e.g., polarizers, compensators, or the like) as well as a shearing element (e.g., a diffraction grating, or the like) to shear collected sample light into two beams with zero path-length difference (0-PLD). The system may further include a spectrometer to generate two-dimensional measurement data that is spectrally-resolved along one direction and may provide spatially-varying signals along an orthogonal direction. In this way, the shearing diffraction may introduce spatially-sensitive variations to the spectral measurement data. In some embodiments, the system includes a lens to image the sheared sample light onto a slit of a spectrometer (e.g., an imaging spectrometer), which may provide spatially-resolved measurements. In some embodiments, sheared beams from the shearing element may be directly incident on the spectrometer, which may generate light-path-distance (LPD) sensitive measurements. For example, the two-dimensional measurement data provided by a detector in the spectrometer may provide separate spectral measurement data as a function of LPD of the illumination beam through the sample.

Further, this technique may be implemented as a single-pass or a multi-pass configuration. For example, a multi-pass configuration may utilize one or more mirrors to direct sample light back to a common location of the sample for multiple interactions at this common location prior to collection and analysis. As another example, a multi-pass configuration may utilize a mirror parallel to the sample to induce repeated interactions at different sample locations prior to collection and analysis. Such a configuration may be well-suited for sample layouts having common features at the different sample locations. In either case, a multi-pass configuration may provide increased sensitivity relative to a single-pass configuration due to the repeated interactions.

It is contemplated herein that spatially-sensitive spectral metrology measurements as disclosed herein may be particularly useful for, but not limited to, measurements of gate-all-around (GAA) nanosheet and nanowire devices (e.g., measurements of SiGe recess, inner spacer, nanosheet release, epitaxial SiGe growth, transistor to transistor level variation, or the like), measurements of memory devices (e.g., measurements of overlay or tilt in DRAM or 3D FLASH devices), measurements of line edge roughness (LER), or measurements of line width roughness (LWR). In some applications, simultaneous measurements of multiple properties of a sample may be generated based on measurements at one or more selected azimuth incidence angles. For example, spatially-sensitive spectral metrology may enable the simultaneous characterization of critical dimension (CD) and edge roughness.

Referring now to FIGS. 1-7, systems and methods providing spatially-accurate spectral metrology measurements, in accordance with one or more embodiments of the present disclosure.

FIG. 1 illustrates a block diagram view of a metrology system 100, in accordance with one or more embodiments of the present disclosure.

In some embodiments, the metrology system 100 includes an illumination source 102 to generate a spectrally-broad illumination beam 104, a spectral metrology sub-system 106 to direct the illumination beam 104 to a sample 108 and collect sample light 110 from the sample 108 in response to the illumination beam 104, a shearing element 112 to shear the sample light 110 into two sheared beams 114, and a spectrometer 116 including a multi-pixel detector 118 to generate spectrally-resolved measurement data of the sample 108.

The illumination source 102 may include any type of illumination source suitable for providing an illumination beam 104 with spectral components suitable for spectral metrology. In some embodiments, the illumination source 102 is a laser source. For example, the illumination source 102 may include, but is not limited to, a broadband laser source, a supercontinuum laser source, a "white light" laser source, or the like. In some embodiments, the illumination source 102 includes a laser-sustained plasma (LSP) source. For example, the illumination source 102 may include, but is not limited to, a LSP lamp, a LSP bulb, or a LSP chamber suitable for containing one or more elements that, when excited by a laser source into a plasma state, may emit broadband illumination. In some embodiments, the illumination source 102 includes a lamp source. In some embodiments, the illumination source 102 may include, but is not limited to, an arc lamp, a discharge lamp, an electrode-less lamp, or the like.

It is contemplated herein that different illumination sources may provide different tradeoffs with respect to spectrum and coherence properties. In a general sense, a maximum shear provided by the shearing element 112 may be limited by the lateral coherence length of the illumination beam 104 since this lateral coherence length may define the conditions under which the sheared beams 114 may interfere. Further, the value of the shear may impact the spatial resolution of a corresponding measurement based on this interference. A relatively small shear may facilitate measurements of spatial variations of relatively small features, whereas a relatively large shear may facilitate measurements of spatial variations of larger features.

As an illustration, a particular LSP source may provide a spectral range of 170-2200 nm and a lateral coherent length of 2 μm, whereas a particular supercontinuum laser may provide a spectral range of 390-2200 and a lateral coherence length of 100 μm. In this illustration, the supercontinuum laser illumination source 102 may provide increased lateral coherence length. Further, a supercontinuum laser illumination source 102 may provide a relatively higher radiance and/or brightness, which may enable higher signal to noise ratios and/or higher acquisition speeds.

The spectral metrology sub-system 106 may include various components suitable for controlling parameters of the illumination beam 104 and/or the sample light 110 such as, but not limited to, polarization, phase, azimuth incidence angle, polar incidence angle, or numerical aperture (NA). For example, the spectral metrology sub-system 106 may include one or more illumination optics 120 to control parameters of the illumination beam 104 and one or more collection optics 122 to control parameters of the sample light 110. In this way, the spectral metrology sub-system 106 may enable measurements of Mueller matrix elements associated with the sample 108 using any technique including, but not limited to, spectral ellipsometry or spectral reflectometry (including variants of any such techniques).

As an illustration, the illumination optics 120 and/or the collection optics 122 may include static or rotating polarizers to control polarizations of the respective light. As another illustration, the illumination optics 120 and/or the collection optics 122 or static or rotating compensators to modify phase of the respective light. As another illustration, the illumination optics 120 and/or the collection optics 122 may include one or more elements to modify the azimuth and/or polar angles associated of the illumination beam 104 and associated sample light 110. For instance, the illumination optics 120 and/or the collection optics 122 may include multiple channels providing different illumination/collection conditions and/or adjustable components (e.g., translation stages to modify positions of one or more optical elements, an adjustable illumination aperture, an adjustable collection aperture, or the like) to dynamically modify the illumination/collection conditions.

The shearing element 112 may include any element known in the art suitable for shearing the sample light 110 collected by the collection optics 122 into two sheared beams. Further, the shearing element 112 may operate in a reflection mode in which the sheared beams 114 are reflected by the shearing element 112 or in a transmission mode in which the sheared beams 114 are generated upon transmission through the sheared beams 114. In some embodiments, the shearing element 112 is a diffraction grating (e.g., a reflective or transmissive diffraction grating).

Various properties of the shearing element 112 may be selected based on the desired application to provide a desired amount of shearing. It is contemplated herein that a shearing angle (e.g., an angle between the sheared beams 114) may impact the spatial resolution or spatial accuracy of a measurement of the metrology system 100 more generally.

The spectrometer 116 may have any design known in the art suitable for generating a two-dimensional measurement signal with a multi-pixel detector 118. In some embodiments, the spectrometer 116 is an imaging spectrometer. For example, an imaging spectrometer may include one or more optical elements with optical power (e.g., a lens or a curved diffractive element) to simultaneously image an entrance slit onto a two-dimensional multi-pixel detector 118 and spectrally disperse light along a direction orthogonal to the entrance slit. In this configuration, a measurement signal generated by the multi-pixel detector 118 may be spectrally resolved along one direction (e.g., based on a dispersive power of a dispersive element in the spectrometer 116) and may provide spatial variation along an orthogonal direction (e.g., associated with a direction of the entrance slit).

In some embodiments, the metrology system 100 includes a controller 124, which may include one or more processors 126 configured to execute a set of program instructions maintained in a memory 128, or memory device.

The one or more processors 126 of a controller 124 may include any processor or processing element known in the art. For the purposes of the present disclosure, the term "processor" or "processing element" may be broadly defined to encompass any device having one or more processing or logic elements such as, but not limited to, one or more central processing units (CPUs), one or more graphical processing units (GPUs), one or more micro-processor devices, one or more application specific integrated circuit (ASIC) devices, one or more field programmable gate arrays (FPGAs), or one or more digital signal processors (DSPs). In this sense, the one or more processors 126 may include any device configured to execute algorithms and/or instructions (e.g., program instructions stored in memory). In some embodiments, the one or more processors 126 may be embodied as a desktop computer, mainframe computer system, workstation, image computer, parallel processor, networked computer, or any other computer system configured to execute program instructions. Moreover, different subsystems of the metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 124 may include one or more controllers housed in a common housing or within multiple housings. In this way, any controller or combination of controllers may be separately packaged as a module suitable for integration into metrology system 100.

The memory 128 may include any storage medium known in the art suitable for storing program instructions executable by the associated one or more processors 126. For example, the memory 128 may include a non-transitory memory medium. By way of another example, the memory 128 may include, but is not limited to, a read-only memory (ROM), a random-access memory (RAM), a magnetic or optical memory device (e.g., disk), a magnetic tape, a solid-state drive and the like. It is further noted that the memory 128 may be housed in a common controller housing with the one or more processors 126. In some embodiments, the memory 128 may be located remotely with respect to the physical location of the one or more processors 126 and the controller 124. For instance, the one or more processors 126 of the controller 124 may access a remote memory (e.g., server), accessible through a network (e.g., internet, intranet and the like).

The program instructions may cause the one or more processors 126 to perform various tasks either directly or indirectly (e.g., via control signals to other components). For example, the processors 126 may receive measurement data from the multi-pixel detector 118 associated with various configurations of the spectral metrology sub-system 106 at one or more incidence angle configurations (e.g., azimuth and/or polar incidence angle configurations). As another example, the processors 126 may determine values of any or all Mueller matrix elements associated with the sample 108 based on the measurement data.

As another example, the controller 124 may one or more measurements of the sample 108 based at least in part on measurement data generated by the multi-pixel detector 118. Measurements of parameters of interest may be generated using a number of algorithms, which may be executed by the controller 124. For example, optical interaction of the incident beam with the sample 108 may be modeled using an EM (electro-magnetic) solver and may utilize algorithms as, but not limited to, rigorous coupled-wave analysis (RCWA), finite element method (FEM), method of moments, surface integral method, volume integral method, or finite-difference time-domain (FDTD) method. The sample 108 may be modeled (e.g., parametrized) using a geometric engine, a process modeling engine or a combination of both. The use of process modeling is generally described in U.S. Pat. No. 10,769,320 issued on Sep. 8, 2020, which is incorporated herein by reference in its entirety. A geometric engine is implemented, for example, in AcuShape software by KLA Corporation.

The controller 124 may analyze collected measurement data using any suitable combination of data fitting and/or optimization techniques such as, but not limited to, libraries, fast-reduced-order models, regression, statistical methods, see e.g. "Statistical model-based metrology," by S. Pandev et al, U.S. Pat. No. 10,101,670; machine-learning algorithms (e.g., neural networks, support-vector machines (SVM); principal component analysis (PCA), independent component analysis (ICA), local-linear embedding (LLE), dimensionality reduction techniques more generally), sparse representation techniques, Fourier transform techniques, wavelet transform techniques; Kalman filtering. Statistical model-based metrology is generally described in U.S. Pat. No. 10,101,670 issued on Oct. 16, 2018, which is incorporated herein by reference in its entirety. The controller 124 may analyze collected measurement data using algorithms that do not include modeling, optimization and/or fitting. Patterned wafer characterization is generally described in U.S. Pat. No. 10,502,694 issued on Dec. 10, 2019, which is incorporated herein by reference in its entirety. In some embodiments, the controller 124 utilizes one or more algorithms to promote matching from same or different tool types.

The controller 124 may be designed to provide efficient performance through any suitable techniques such as, but not limited to, parallelization, distribution of computation, load balancing, multi-service support, dynamic load optimization, or the like. Further, the controller 124 may implement any steps using any type or combination of configurations such as, but not limited to, dedicated hardware (e.g., FPGAs, or the like), software, or firmware.

The controller 124 may further generate any type of measurement of the sample 108 (or a portion thereof) based at least in part on measurement data from the multi-pixel detector 118. In some embodiments, the controller 124 generates a metrology measurement such as, but not limited to, an overlay measurement, a critical dimension (CD) measurement, a shape measurement (e.g., a height measurement, a tilt measurement, a sidewall angle measurement, or the like), a stress measurement, a composition measurement, a bandgap measurement, a measurement of electrical properties, or a measurement of process conditions (e.g., focus and/or dose conditions, a resist state, a partial pressure, a temperature, a focusing model, or the like). In some embodiments, the controller 124 generates an inspection measurement in which one or more defects on the sample 108 are at least one of identified or classified.

The metrology system 100 and any of its components may be configured to implement a recipe (e.g., a measurement recipe), which may define various configuration parameters and/or steps to be performed in a measurement or a series of measurements.

For example, a recipe may include various aspects of a design of a sample 108 including, but not limited to, a layout of features on one or more sample layers, feature sizes, or feature pitches. As another example, a recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters. By way of another example, a recipe may include various processing steps (e.g., that may be implemented by the controller 124 to generate measurements based on measurement data generating according to the recipe.

Together, the various components of the metrology system 100 may utilize shearing interferometry to provide spatially-sensitive spectral measurements (e.g., spectral ellipsometry measurements) of a sample 108. Put another way, the various components of the metrology system 100 may utilize shearing interferometry to characterize local variations of various properties of the sample 108 at length scales smaller than a spot size of the illumination beam 104 on the sample 108. Accordingly, the metrology system 100 may employ shearing diffraction interferometry (SDI) to provide spatially-varying measurements of any type of spectral measurement data (e.g., spectral ellipsometry signals, or the like).

Referring now to FIGS. 2A-2D, various implementations of spatially-varying spectral measurements are described in greater detail, in accordance with one or more embodiments of the present disclosure.

Figure 2A:
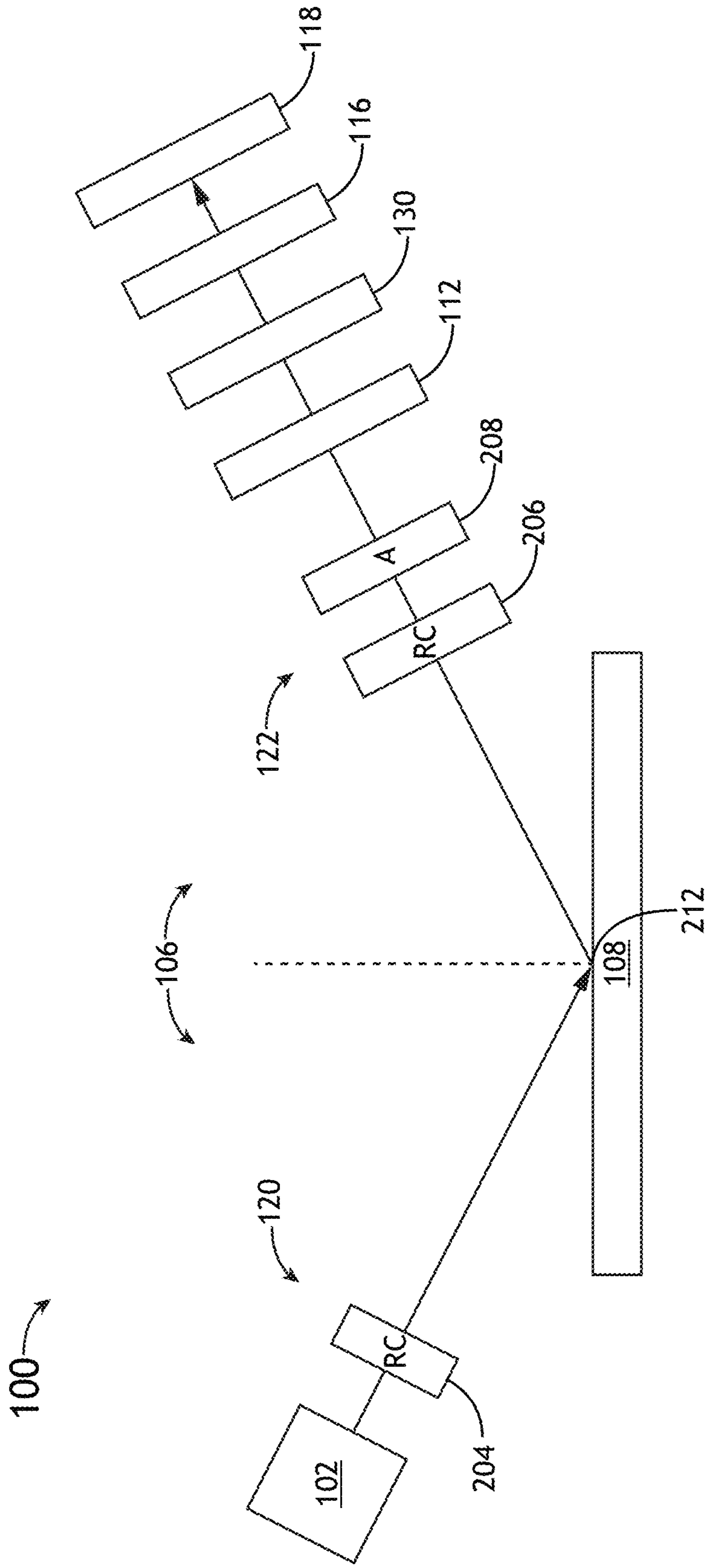
FIG. 2A illustrates a simplified schematic of the metrology system configured to image a sample onto a spectrometer, in accordance with one or more embodiments of the present disclosure.

FIG. 2A illustrates a simplified schematic of the metrology system 100 configured to image the sample 108 onto the spectrometer 116, in accordance with one or more embodiments of the present disclosure. In some embodiments, the metrology system 100 includes a lens 130 or other element with optical power to generate an image of the sample 108 onto an entrance slit of the spectrometer 116 (e.g., an imaging spectrometer) based on interfering (e.g., having multiple light waves interact with another) the two sheared beams 114 provided by the shearing element 112. Accordingly, the multi-pixel detector 118 may be located at a field plane that is conjugate to the sample 108.

Figure 2B:
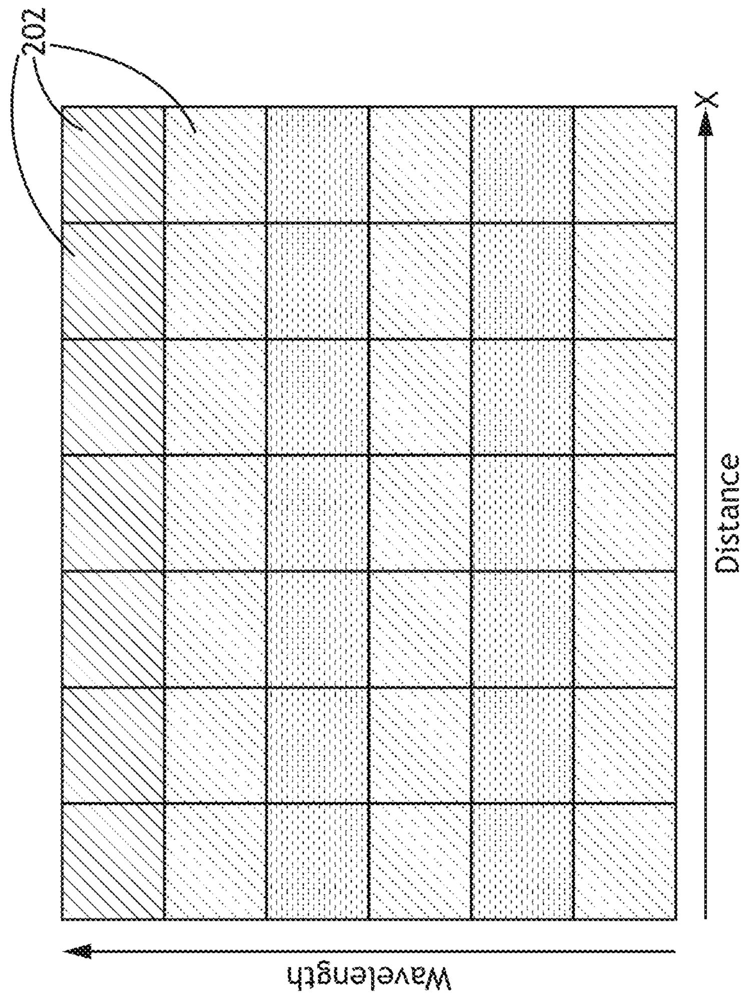
FIG. 2B illustrates a simplified depiction of metrology data generated by a multi-pixel detector in the configuration of FIG. 2A, in accordance with one or more embodiments of the present disclosure.

In this configuration, the multi-pixel detector 118 may generate spectrally-resolved spectral metrology data (e.g., spectral ellipsometry data, or the like). FIG. 2B illustrates a simplified depiction of metrology data generated by a multi-pixel detector 118 in the configuration of FIG. 2A, in accordance with one or more embodiments of the present disclosure. In particular, the configuration of FIG. 2A may provide that columns of pixels 202 of a multi-pixel detector 118 may capture spectral data (e.g., associated with various wavelengths of the illumination beam 104), while rows of pixels 202 may correspond to different spatial locations on the sample 108. Further, in this configuration, the Y direction in the figure along the rows of pixels 202 may correspond to a real-space dimension (e.g., a physical dimension of the sample 108) such that the multi-pixel detector 118 may provide spatially-resolved spectral data of the sample 108 at a resolution smaller than a spot size of the illumination beam 104 on the sample 108.

The spectral resolution of the two-dimensional metrology data provided by the multi-pixel detector 118 may be controlled by parameters such as, but not limited to, the spectral content of the illumination beam 104, the resolving power of the spectrometer 116 (e.g., a dispersion of a grating or other dispersive element in the spectrometer 116), or a size of the pixels 202 of the multi-pixel detector 118.

The spatial resolution of the two-dimensional metrology data provided by the multi-pixel detector 118 may be controlled by parameters such as, but not limited to, the shear between the sheared beams 114, a magnification of an image of the sample 108 on the multi-pixel detector 118, or a size of the pixels 202 of the multi-pixel detector 118. For example, a sensitivity to variations of features of a particular size on the sample 108 (or associated spacing) may be limited by a number of repetitions of the features within the shear distance. In general, relatively larger shear distances may be suitable for measuring spatial variations at relatively larger spatial scales, whereas relatively smaller shear distances may be suitable for measuring spatial variations at relatively smaller spatial scales. In this way, the dispersion of the shearing element 112 (e.g., a pitch of a grating forming the shearing element 112) may be selected based on the wavelengths providing sensitivity to a particular measurement and the size/periodicity of a feature of interest.

Referring again to FIG. 2A, the spectral metrology sub-system 106 may include any combination of components suitable for generating any type of spectral data. For example, the illumination optics 120 in FIG. 2A include a first rotating compensator (RC) 204, whereas the collection optics 122 include a second rotating compensator 206 as well as an analyzer (A) 208. However, this is merely an illustration and should not be interpreted as limiting the scope of the present disclosure.

The spectral metrology sub-system 106 may further provide single-pass or multi-pass operation. For example, FIG. 2A depicts a single-pass configuration in which the sample light 110 captured by the collection optics 122 is associated with a single interaction of the illumination beam 104 with a single location on the sample 108. In a multi-pass configuration, the sample light 110 collected by the collection optics 122 may be associated with multiple interactions of light with the sample 108 at the same or different locations. It is contemplated herein that a multi-pass configuration may provide increased sensitivity relative to a single-pass configuration.

Figure 2C:
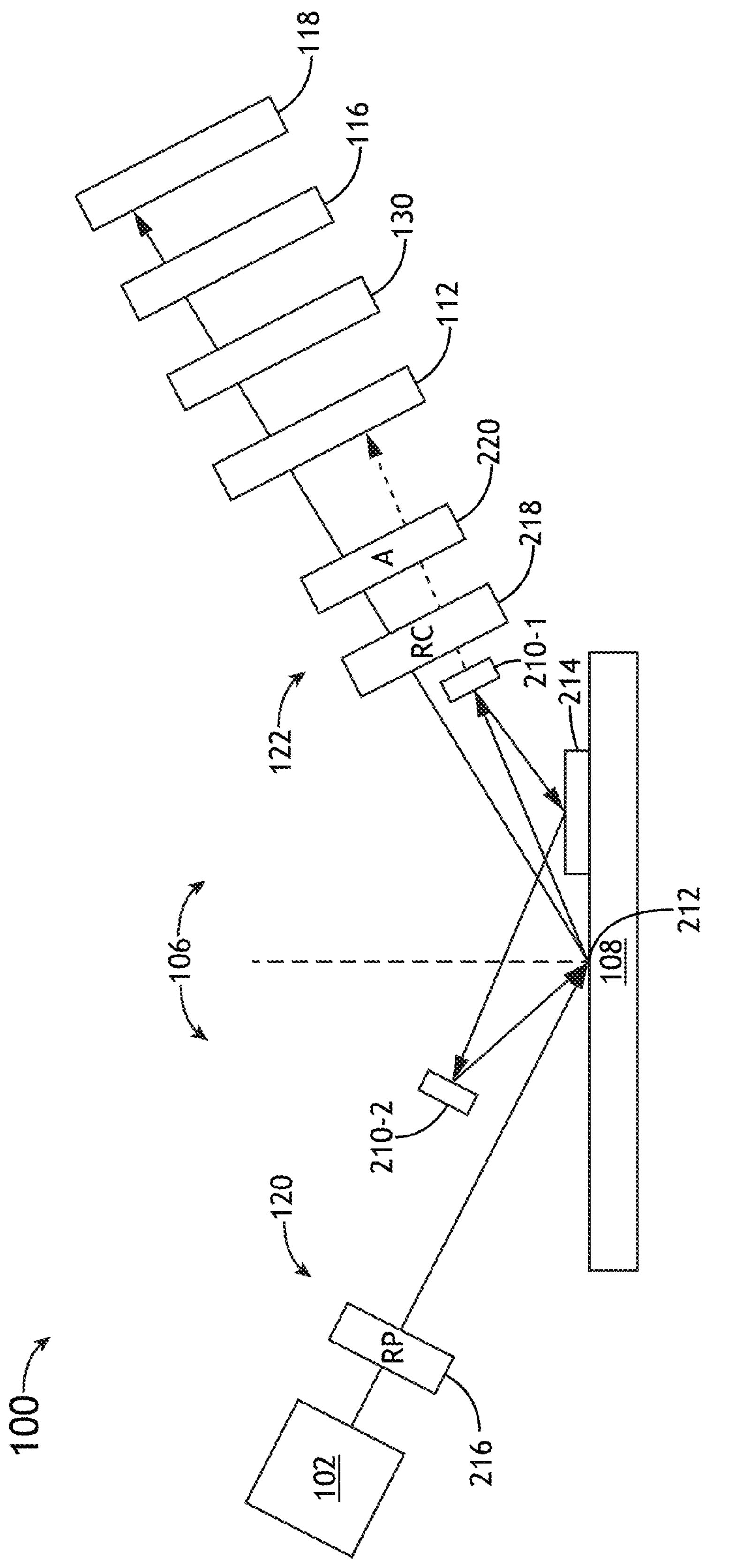
FIG. 2C illustrates a simplified schematic of the metrology system configured to image a sample onto a spectrometer using a first multi-pass configuration, in accordance with one or more embodiments of the present disclosure.

FIG. 2C illustrates a simplified schematic of the metrology system 100 configured to image the sample 108 onto the spectrometer 116 using a first multi-pass configuration, in accordance with one or more embodiments of the present disclosure.

In some embodiments, the metrology system 100 includes one or more mirrors 210 to redirect the sample light 110 to a common location of the sample 108 for one or more repeated interactions prior to the one or more collection optics 122. In a general sense, the metrology system 100 may include any number or orientation of mirrors 210 to provide any number of repeated interactions of light (e.g., an illumination beam 104 and corresponding sample light 110) on a common location of the sample 108. Further, in some embodiments, this light may be incident on one or more modulating targets, which may provide modulated spectral metrology data (e.g., modulated spectral ellipsometry data, or the like). Modulated spectral metrology is generally described in U.S. patent application Ser. No. 18/743,118, filed Jun. 14, 2024, which is incorporated herein by reference in its entirety.

As an illustration, FIG. 2C depicts a two-pass configuration including a first mirror 210-1 to receive sample light 110 associated with a first interaction of the illumination beam 104 with the sample 108 at a particular location 212, where the first mirror 210-1 directs the associated sample light 110 to a modulation target 214 and then to a second mirror 210-2, which in turn directs the sample light 110 back to the same location 212. The resulting sample light 110 is then collected by the collection optics 122 to generate measurements in a manner similar to that described with respect to FIGS. 2A-2B. The modulation target 214 may be located at any location including external to the sample 108 or on the sample 108. It is to be understood that FIG. 2C is not limiting, however, and that the metrology system 100 may provide any number of mirrors 210 and/or modulation targets 214. For example, a modulation target 214 may be located on a sample 108 (e.g., as depicted in FIG. 2C) or provided as a component of the metrology system 100. Additionally, a modulation target 214 may be formed from any suitable material including, but not limited to, silicon oxide having a selected thickness to provide a selected modulation.

Further, the metrology system 100 may selectively switch between a single-pass configuration as depicted in FIG. 2A and a multi-pass configuration as depicted in FIG. 2C by selectively removing or inserting the first mirror 210-1.

The spectral metrology sub-system 106 may include any combination of illumination optics 120 and collection optics 122 to provide any type of spectral metrology measurement. For example, the illumination optics 120 may include any combination of illumination polarizers and illumination compensators while the collection optics 122 may include any combination of collection polarizers and collection compensators. For instance, FIG. 2C depicts illumination optics 120 including a rotating polarizer (RP) 216, along with collection optics 122 including a rotating compensator (RC) 218 and an analyzer (A) 220. However, this is merely illustrative and not limiting on the scope of the present disclosure.

A multi-pass configuration providing repeated interactions of light with a common location on a sample 108 (e.g., as depicted in FIG. 2C) may be particularly suitable for, but is not limited to, measurements of spatial variations in a particular location 212.

In some embodiments, the metrology system 100 includes a mirror 210 placed near the sample 108 and oriented to induce multiple reflections of the sample light 110 on a series of different locations 222 on the sample 108 prior to entering the collection optics 122. Such a configuration may be suitable for a sample 108 including repeating structures that may be analyzed by the repeated interactions of the sample light 110 with the different spatially-dispersed locations 222 such as, but not limited to, memory devices or repeated transistors.

Figure 2D:
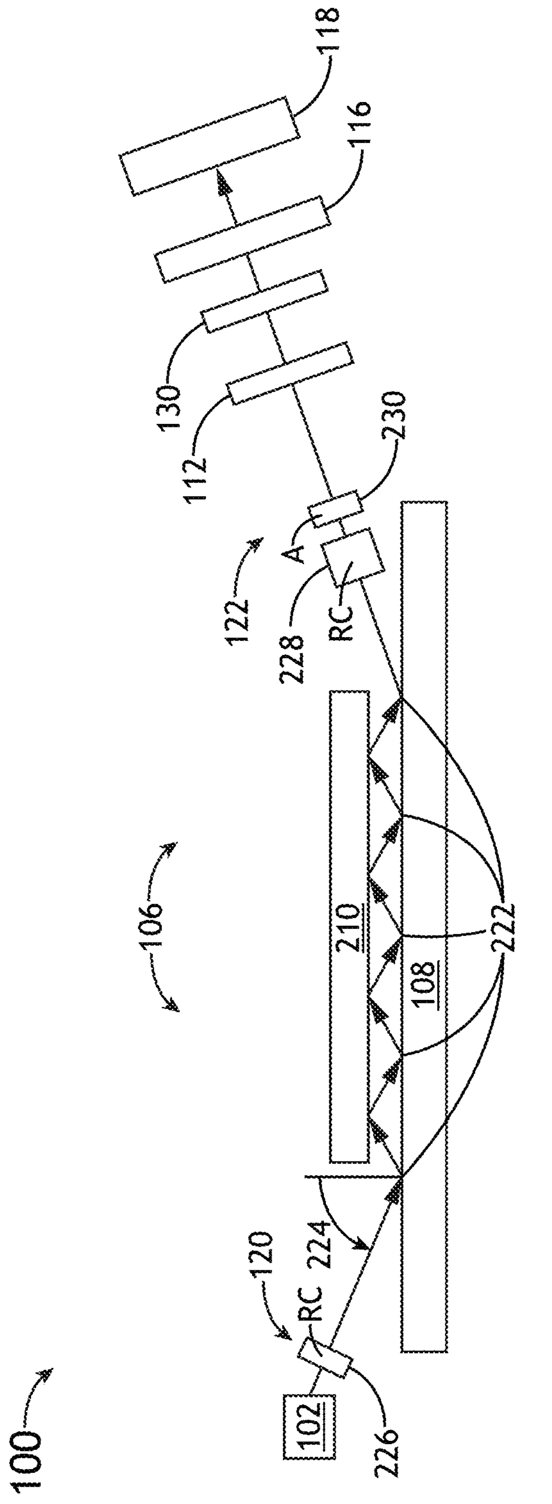
FIG. 2D illustrates a simplified schematic of the metrology system configured to image the sample onto the spectrometer using a second multi-pass configuration, in accordance with one or more embodiments of the present disclosure.

As an example, FIG. 2D illustrates a simplified schematic of the metrology system 100 configured to image the sample 108 onto the spectrometer 116 using a second multi-pass configuration, in accordance with one or more embodiments of the present disclosure. In FIG. 2D, the mirror 210 is placed substantially parallel to the sample 108 to promote multiple reflections of the sample light 110 on the sample 108.

The number of interactions and/or the spacing between interactions between the sample light 110 and the sample 108 may be controlled through parameters such as, but not limited to, a polar incidence angle 224 of the illumination beam 104 or a separation distance between the sample 108 and the mirror 210. Further, a length of the mirror 210 may impact a number of interactions. In some embodiments, such parameters are selected to ensure that each of the locations 222 includes common features. For instance, such parameters may be selected to provide that the locations 222 are within a common device (e.g., DRAM cell) or die (e.g., logic die).

Additionally, the spectral metrology sub-system 106 may provide any combination of illumination optics 120 and/or collection optics 122 suitable for providing a desired type of spectroscopic metrology measurement. For example, FIG. 2D depicts a configuration in which the illumination optics 120 include a rotating compensator (RC) 226, whereas the collection optics 122 include a rotating compensator (RC) 228 and an analyzer (A) 230. However, this is merely illustrative and not limiting on the scope of the present disclosure.

Referring now to FIGS. 3A-4C, LPD-resolved spectral metrology measurements are described, in accordance with one or more embodiments of the present disclosure.

Figure 3A:
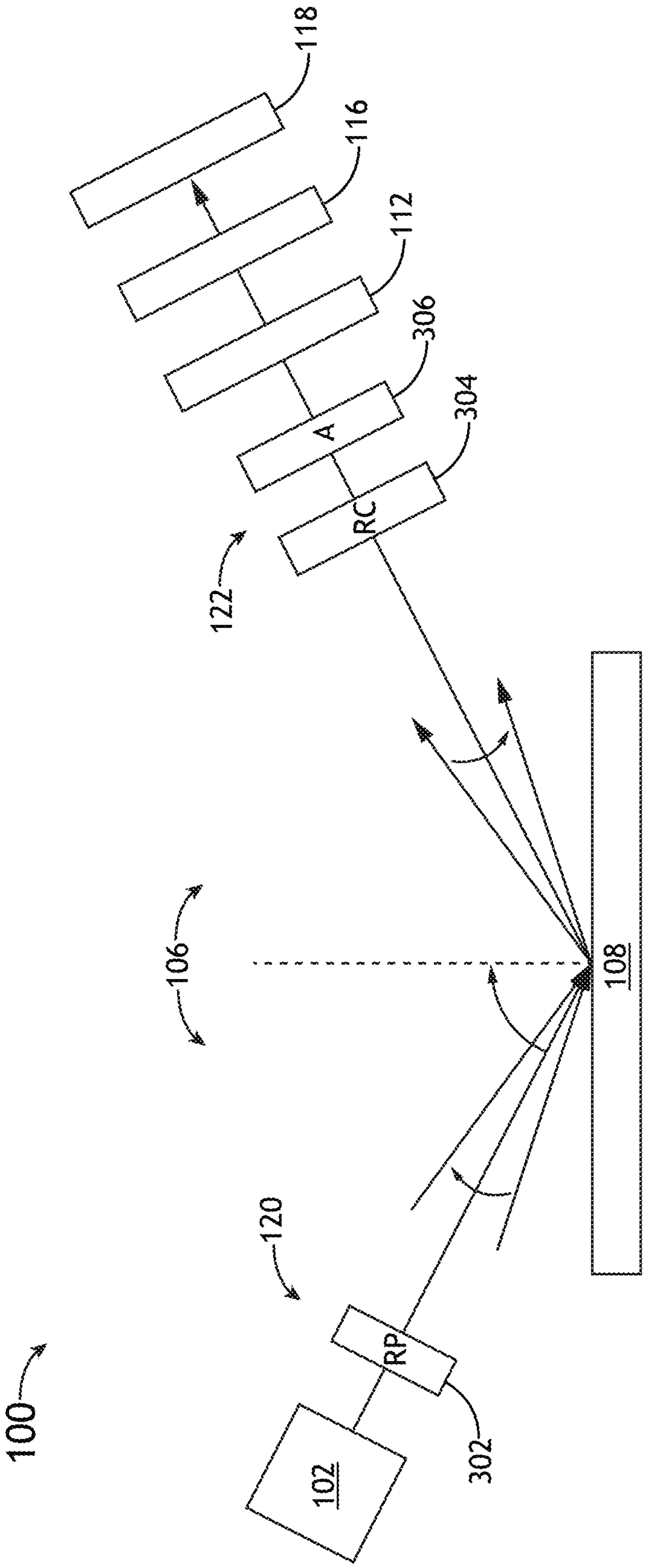
FIG. 3A illustrates a simplified schematic of the metrology system configured to provide light-path-distance (LPD)-sensitive measurements, in accordance with one or more embodiments of the present disclosure.

FIG. 3A illustrates a simplified schematic of the metrology system 100 configured to provide LPD-sensitive measurements, in accordance with one or more embodiments of the present disclosure. FIG. 3A is substantially similar to FIG. 2A, except that FIG. 3A does not include the lens 130. In this way, FIG. 3A is a non-imaging configuration in which the sheared beams 114 are routed directly to an entrance slit of the spectrometer 116 and the multi-pixel detector 118 is not at a field plane (e.g., an imaging plane).

Figure 3B:
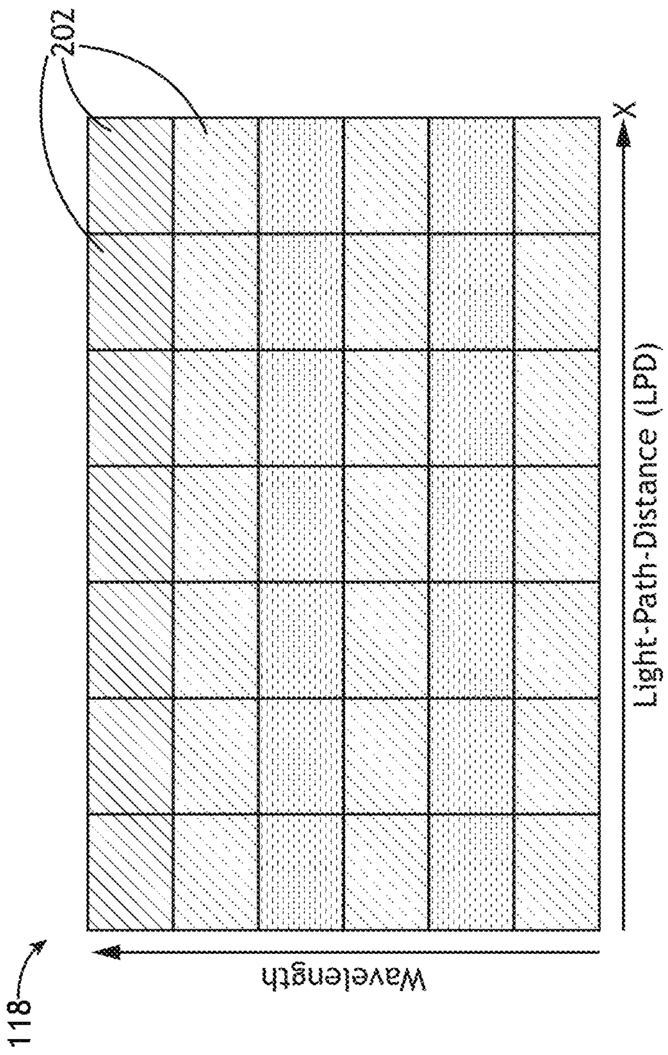
FIG. 3B illustrates a simplified depiction of metrology data generated by a multi-pixel detector in the configuration of FIG. 3A, in accordance with one or more embodiments of the present disclosure.

FIG. 3B illustrates a simplified depiction of metrology data generated by a multi-pixel detector 118 in the configuration of FIG. 3A, in accordance with one or more embodiments of the present disclosure. In particular, the configuration of FIG. 3A may provide that columns of pixels 202 of a multi-pixel detector 118 may capture spectral data (e.g., associated with various wavelengths of the illumination beam 104), while rows of pixels 202 may correspond to different LPDs of the illumination beam 104 through the sample 108.

It is contemplated herein that LPD-sensitive metrology measurements may be well-suited for, but not limited to, measurements of the local variation of complex structures in which the illumination beam 104 propagates substantially through the structures. As an illustration, LPD-sensitive metrology measurements may be well suited for, but not limited to, measurements of the regular structure profile and/or local variability in 3D FLASH structures. Further, LPD-sensitive metrology may be well-suited for measurements of LER and/or LWR.

As described with respect to FIGS. 2A-2D, the spectral metrology sub-system 106 may include any combination of illumination optics 120 and/or collection optics 122 to provide any desired spectral metrology measurement. For example, FIG. 3A depicts illumination optics 120 including a rotating polarizer (RP) 302 (or rotating compensator), along with collection optics 122 including a rotating compensator (RC) 304 and an analyzer (A) 306. However, this is merely illustrative and not limiting on the scope of the present disclosure.

Further, it is noted that although FIG. 3A may closely resemble FIG. 2A, the physical arrangement of various components and/or the properties of the illumination beam 104 may vary between the two configurations. For example, the numerical aperture of the illumination beam 104 and/or the sample light 110 in FIG. 3A may be substantially smaller than for the configuration in FIG. 2A. As an illustration, the NA of the collected sample light 110 may be limited to limit LPD variations associated with the NA and thus increase a sensitivity to LPD variations in the sample 108. In some cases, the collection NA of the sample light 110 may be in a range of 0.004 to 0.008 in a polar direction (e.g., an angle-of-incidence direction) and in a range of 0.005-0.01 in an azimuth direction.

Figure 4A:
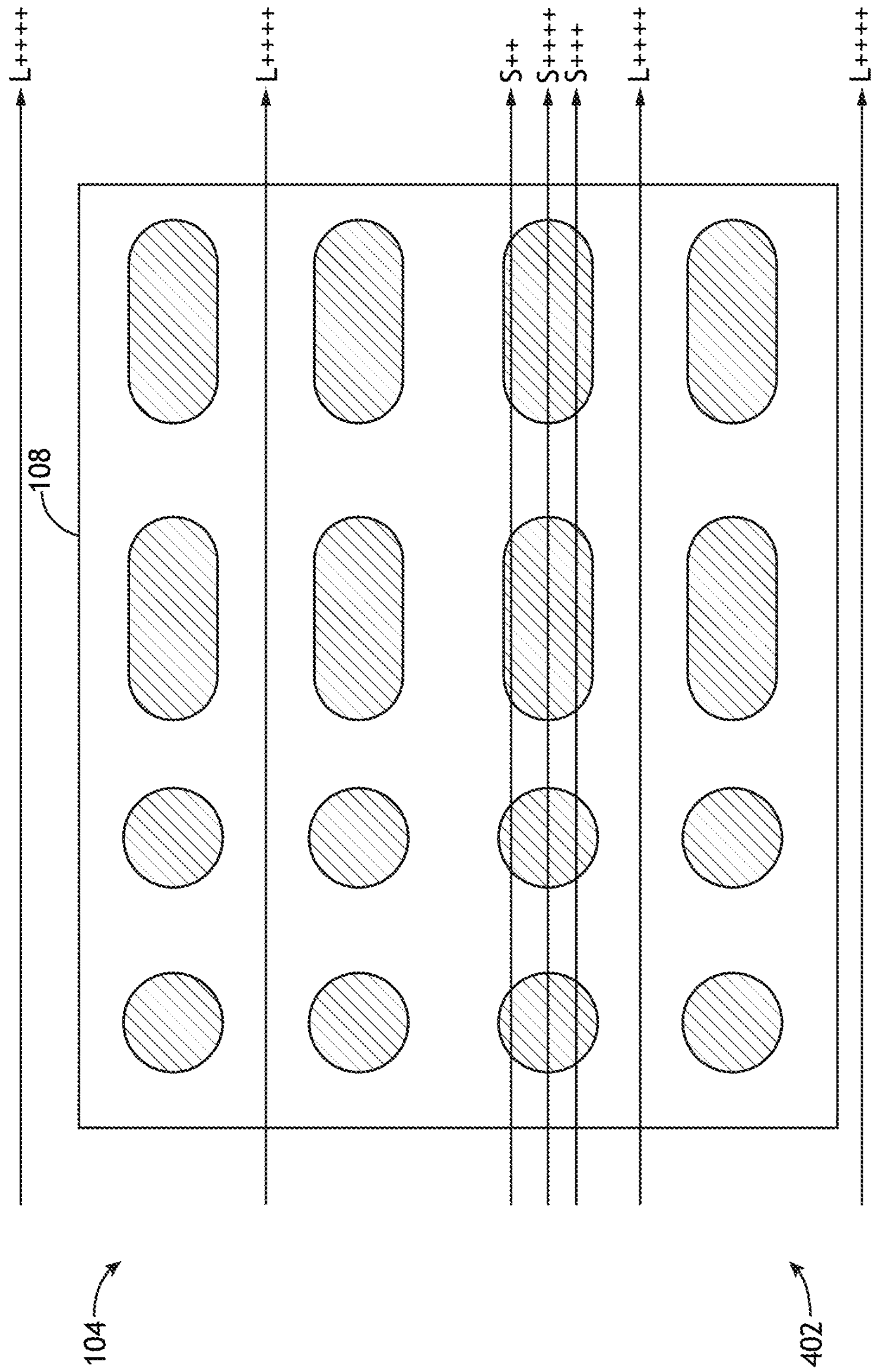
FIG. 4A illustrates various light paths of the illumination beam through a portion of a 3D memory structure from a first azimuth incidence angle, in accordance with one or more embodiments of the present disclosure.
Figure 4B:
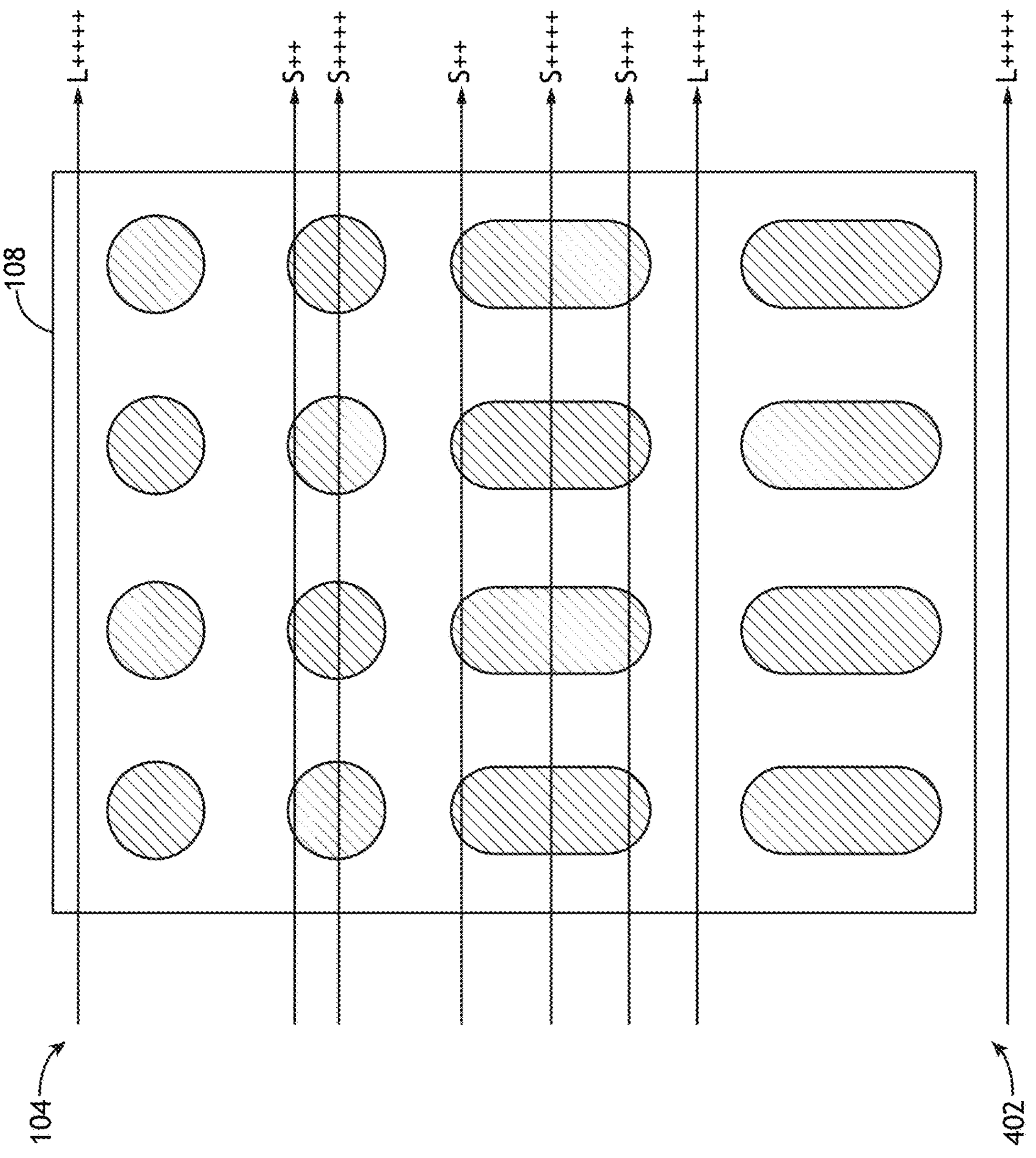
FIG. 4B illustrates various light paths through a portion of the 3D memory structure in FIG. 4A from a second azimuth incidence angle, in accordance with one or more embodiments of the present disclosure.
Figure 4C:
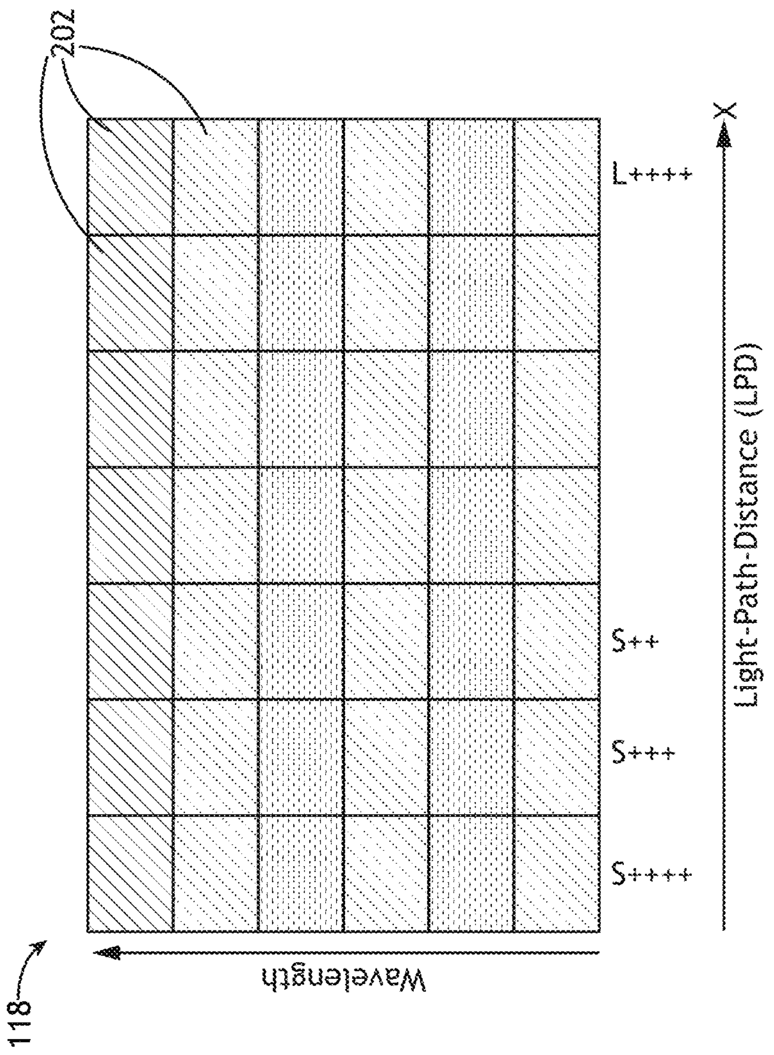
FIG. 4C illustrates a simplified depiction of metrology data generated by a multi-pixel detector in the configuration of either FIG. 4A or 4B, in accordance with one or more embodiments of the present disclosure.

FIGS. 4A-4C depict a non-limiting example of LPD-resolved spectral metrology for a 3D memory structure.

FIG. 4A illustrates various light paths 402 of the illumination beam 104 through a portion of a 3D memory structure from a first azimuth incidence angle (Az=0), in accordance with one or more embodiments of the present disclosure. FIG. 4B illustrates various light paths 402 through a portion of the 3D memory structure in FIG. 4A from a second azimuth incidence angle (Az=90), in accordance with one or more embodiments of the present disclosure. In particular, the light paths 402 may represent different portions of an illumination beam 104. Due to the complex geometry of the 3D memory structure, different paths have different LPDs. In FIGS. 4A-4B, the light paths 402 are labeled with relative markings to show the relative LPDs, where L represents a relatively long path length, S represents a relatively short path length, and a number of plus signs (+) represents a degree in either direction (e.g., long or short). For example, L++++ represents a longest LPD and S++++ represents a shortest LPD. Together FIGS. 4A-4B depict a range of LPD values measurable in two orthogonal directions to fully characterize the 3D memory structure.

FIG. 4C illustrates a simplified depiction of metrology data generated by a multi-pixel detector 118 in the configuration of either FIG. 4A or 4B, in accordance with one or more embodiments of the present disclosure. In particular, FIG. 4C illustrates how separate specular data (columns) is provided for a range LPDs, which are labeled by the relative markings in FIGS. 4A-4B as S++++ to L++++. In this way, spectral metrology data may be separately generated, modeled, and fit for different LPDs of light through a structure on the sample 108. For example, spectral metrology data associated with each column (or groups of columns) may be separately modeled and fit to provide measurements associated with the associated LPDs. As a result, spectral metrology data may be generated that are associated with selected aspects of the vertical structure in the 3D memory device, which may enable a more accurate and faster metrology for the structure than traditional methods in which all structural aspects are condensed in one spectral data set. In addition, the LPD-resolved method may allow over fill of the target in the illumination of sample 108 without sacrificing metrology accuracy. This configuration may provide substantial benefits over traditional spectral metrology techniques (e.g., traditional spectral ellipsometry, or the like) that provides a single combined set of spectral measurement data for all LPDs.

It is contemplated herein that this configuration may also provide for a rich dataset that may allow for a selective elimination of data that does not conform to a particular model. For example, a metrology measurement (e.g., CD, overlay, tilt, or any other measurement) associated with a particular LPD may be generated by fitting the associated spectral metrology data (e.g., associated columns or groups of columns in FIG. 4C) to a model relating the particular metrology measurement to spectral properties. However, it may be the case that a goodness of fit of some LPDs may be better than others. Put another way, a particular model may be more sensitive for some LPDs than others. In this case, spectral measurement data (e.g., columns or groups of columns in FIG. 4C) that fail to meet a selected quality threshold (e.g., a goodness of fit threshold) may be disregarded. As a result, the remaining data may be relatively high-quality data suitable for sensitive and accurate metrology measurements.

Referring now broadly to FIGS. 3A-4C, it is contemplated herein that LPD-sensitive spectral metrology may enable the simultaneous measurement of multiple properties of structures on the sample 108. As an illustrative example, the S++++ rays in FIG. 4B may propagate through center portions of open structures such that the associated spectral measurement data (e.g., associated columns or groups of columns of the multi-pixel detector 118) may be suitable for, but not limited to, generating CD measurements of the open structures along the measurement direction (e.g., the Az=90 direction). As another illustrative example, the S++ structures rays in both FIGS. 4A and 4B may propagate along edges of the open structures such that the associated spectral measurement data may be suitable for, but not limited to, measurements of LER and/or LWR of the associated structures along the associated measurement directions.

Figure 5:
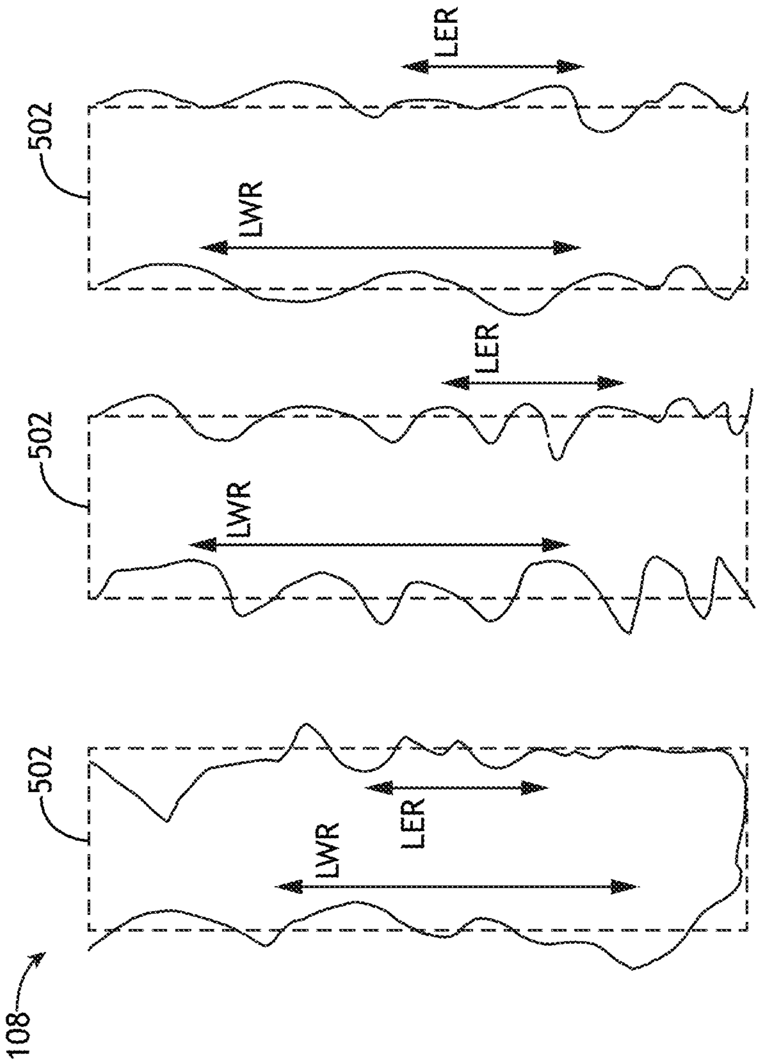
FIG. 5 illustrates a conceptual depiction of edge roughness, in accordance with one or more embodiments of the present disclosure.

FIG. 5 illustrates a conceptual depiction of LER and LWR, in accordance with one or more embodiments of the present disclosure. In particular, FIG. 5 depicts three line structures 502, which are shown to exhibit variations along the patterned edges. These variations may arise from multiple phenomena including, but not limited to, stochastic effects. For example, stochastic variations associated with photon counts and/or photoresist chemistry may result in stochastic variations along patterned edges. Often, pattern edges may exhibit roughness along multiple length scales. LER (line edge roughness) typically refers to relatively high-spatial-frequency variations along a pattern edge and is typically characterized by a relatively low amplitude. LWR (line width roughness) typically refers to relatively low-spatial-frequency variations along a pattern edge and is typically characterized by a relatively higher amplitude than LER.

It is contemplated herein that detecting and managing LER and LWR is a critical concern for many extreme ultraviolet (EUV) processes for many applications including, but not limited to, logic and DRAM patterning. As an illustration, LER and LWR may be on the order of 0-5 nm for features with CDs (e.g., critical dimensions associated with structure width) in a range of 8-10 nm. Further, photoresists used for EUV processes are typically thin (e.g., on the order of 10-30 nm) such that spectral measurement data is generally weak. As a result, typical attempts to measure CD as well as LER/LWR using a single set of spectral measurement data from a typical spectral metrology tool (e.g., a single set of spectral ellipsometry data from a typical spectral ellipsometry tool) is often unreliable.

However, the systems and methods disclosed herein for LPD-sensitive spectral metrology generate separate spectral measurement data for these different measurements (e.g., based on different LPDs), which enables separate measurements that may be used to distinguish between CD and edge roughness (LER/LWR).

FIGS. 6A-6D provide an illustration of the use of LPD-sensitive spectral metrology to separate the effects of CD and edge roughness (LER/LWR).

Figure 6A:
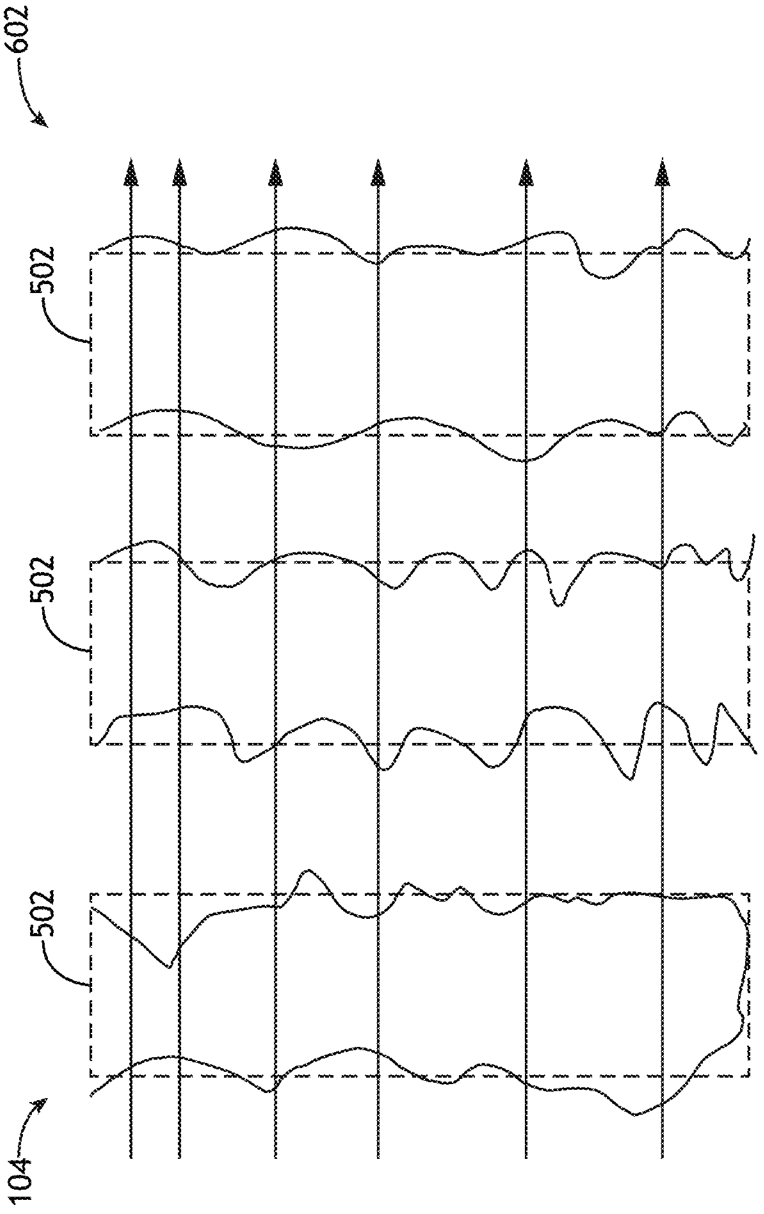
FIG. 6A illustrates a series of light paths of an illumination beam through the line structures in FIG. 5 at a first azimuth incidence angle in which the illumination beam propagates along a long direction of the line structures, in accordance with one or more embodiments of the present disclosure.
Figure 6B:
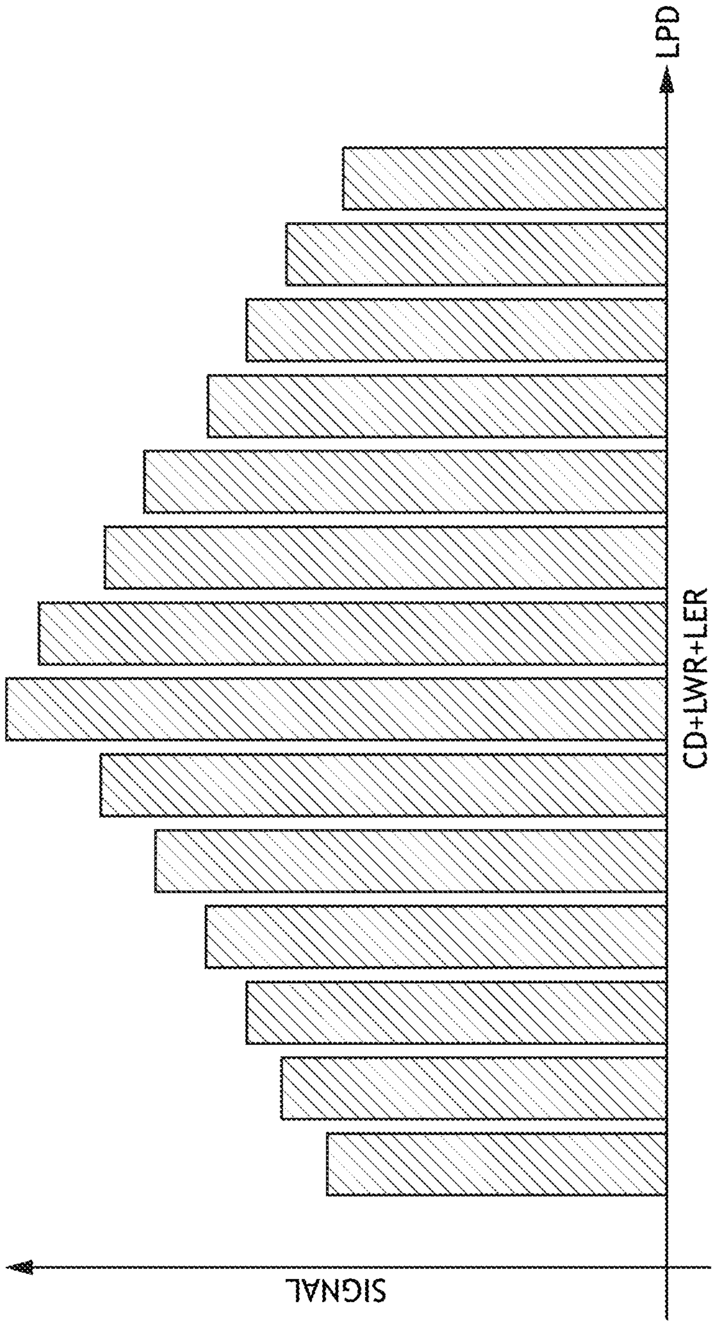
FIG. 6B illustrates a simplified histogram of spectral measurement data using the configuration in FIG. 6A as a function of LPD, in accordance with one or more embodiments of the present disclosure.

FIG. 6A illustrates a series of light paths 602 of an illumination beam 104 through the line structures 502 in FIG. 5 at a first azimuth incidence angle (Az=90) in which the illumination beam 104 propagates along a long direction of the line structures 502, in accordance with one or more embodiments of the present disclosure. FIG. 6B illustrates a simplified histogram of spectral measurement data using the configuration in FIG. 6A as a function of LPD, in accordance with one or more embodiments of the present disclosure. In this orientation, the dimensions of the CD and edge roughness are sufficiently close to result in a continuous range of LPD values with substantive spectral measurement data.

Figure 6C:
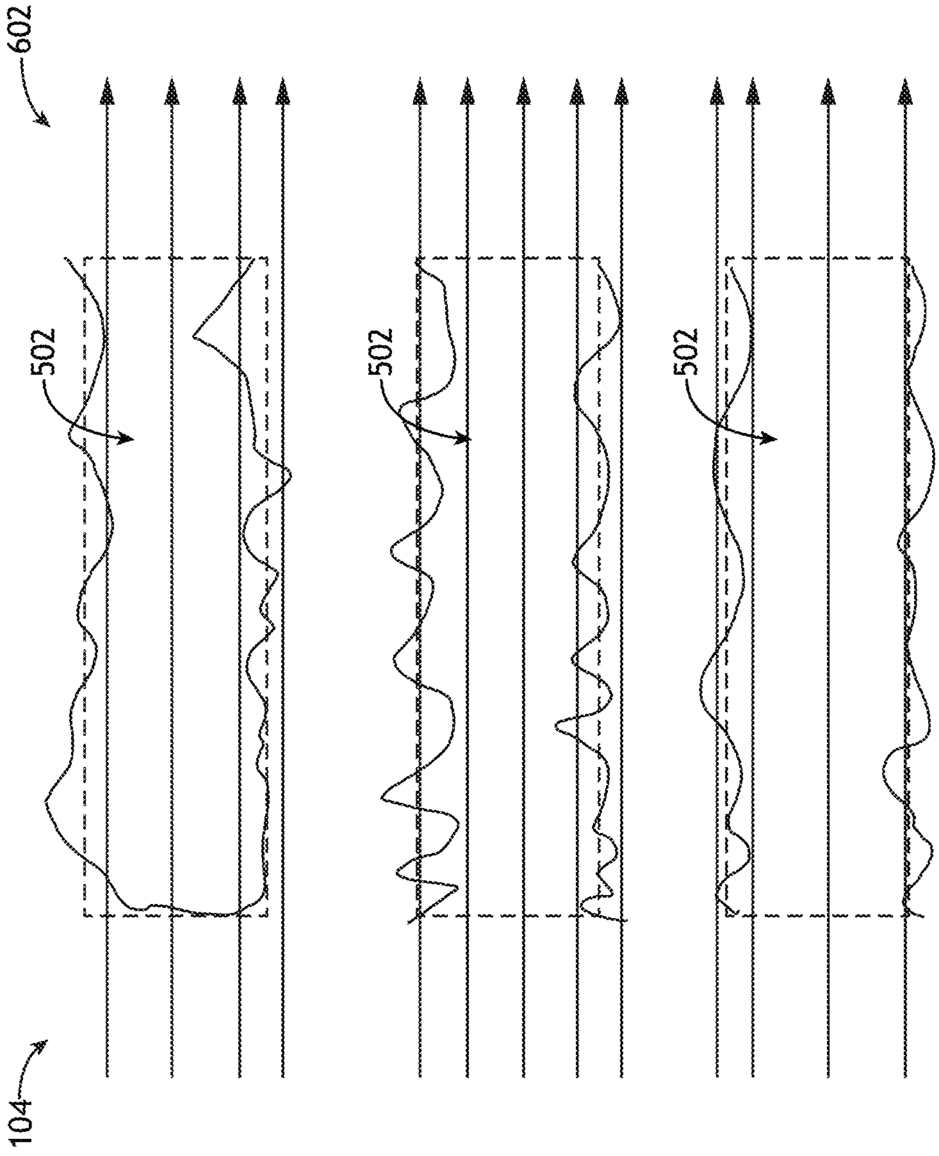
FIG. 6C illustrates a series of paths of an illumination beam through the line structures in FIG. 5 at a second azimuth incidence angle in which the illumination beam propagates along a long direction of the line structures, in accordance with one or more embodiments of the present disclosure.
Figure 6D:
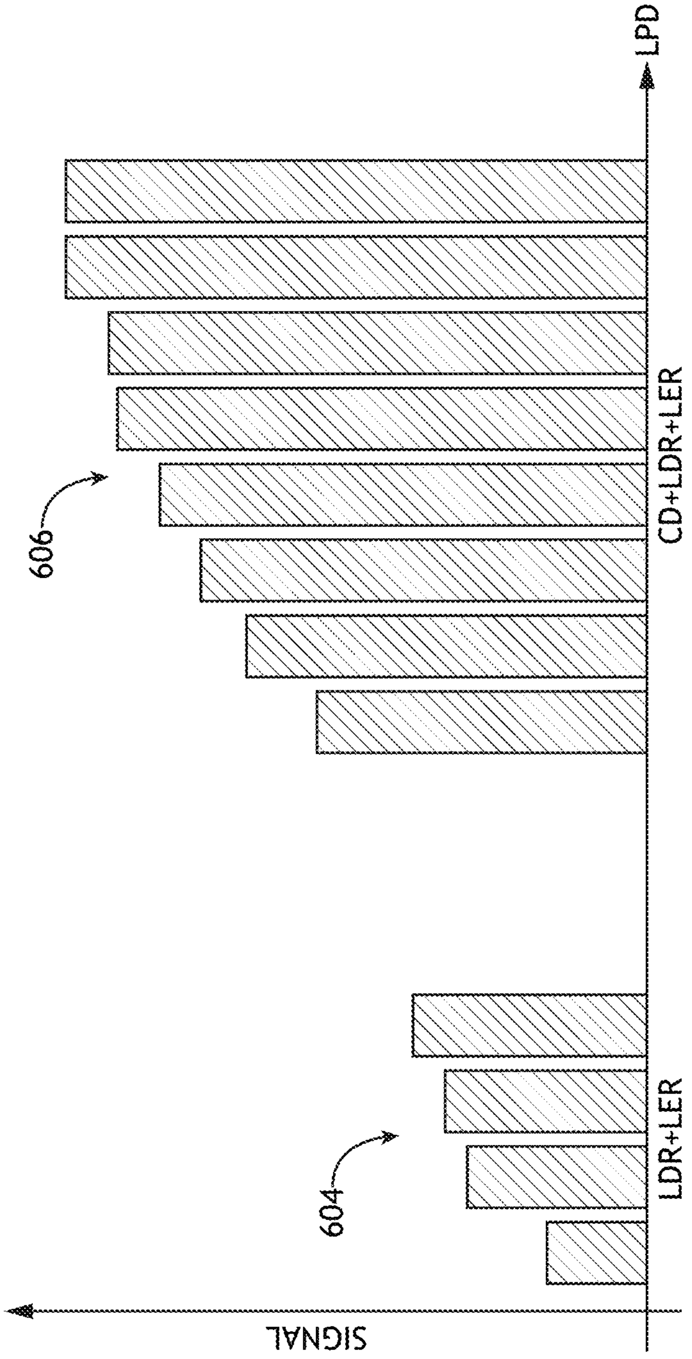
FIG. 6D illustrates a simplified histogram of spectral measurement data using the configuration in FIG. 6C as a function of LPD, in accordance with one or more embodiments of the present disclosure.

FIG. 6C illustrates a series of light paths 602 of an illumination beam 104 through the line structures 502 in FIG. 5 at a second azimuth incidence angle (Az=0) in which the illumination beam 104 propagates along a long direction of the line structures 502, in accordance with one or more embodiments of the present disclosure. FIG. 6D illustrates a simplified histogram of spectral measurement data using the configuration in FIG. 6C as a function of LPD, in accordance with one or more embodiments of the present disclosure.

As seen in FIGS. 6C-6D, orienting the illumination beam 104 lengthwise along line structures 502 may provide a range of LPD values 604 that may be attributed primarily to edge roughness (LER/LWR). Such a configuration may thus have a higher sensitivity to edge roughness. FIG. 6D further shows a second range of LPD values 606 that may be attributed primarily to CD, though edge roughness (LER/LWR) may further spread a signal distribution within this range. As a result, the measurement may have a higher sensitivity to CD, but may have an acceptable sensitivity to edge roughness.

Taken together, FIGS. 6A-6D illustrate how the azimuth incidence angle (e.g., the illumination direction) may impact LPD-sensitive measurements. In some embodiments, LPD-sensitive measurements are taken from particular azimuth incidence angles designed to promote certain measurements (e.g., measurements along the length of line structures 502 in FIGS. 6C-6D designed to generate distinct data for edge roughness measurements). In some embodiments, LPD-sensitive measurements are taken from multiple azimuth incidence angles. In this way, the data from these multiple azimuth incidence angles may be used together with knowledge of the physical layout of the sample 108 to generate measurements of multiple properties of the sample 108.

In some embodiments, the metrology system 100 is configured to provide simultaneous measurements of CD and edge roughness (LER/LWR) with a multi-pass configuration, which may increase the measurement sensitivity. For example, the multi-pass configuration of the metrology system 100 in FIG. 2D may be adapted in various ways to facilitate simultaneous measurements of CD and edge roughness. As an illustration, the lens 130 may be removed to provide measurements in a non-imaging configuration, which may be suitable for LPD-sensitive measurements that benefit from the multi-pass configuration. As another illustration, the mirror 210 may be provided as a modulator (e.g., a reflective modulator). In this configuration, the modulator may have well-known structures designed to enhance sensitivity to a particular measurement and/or reduce correlation between certain measurements. As an illustration, a modulator may include a series of trenches (e.g., Si trenches) with known CD and negligible edge roughness. As another illustration, a modulator may include structures designed to enhance LER/LWR sensitivity and/or reduce correlation between LER and LWR signals.

Referring now generally to FIGS. 1-6D, it is contemplated herein that the properties of the shearing element 112 and/or the illumination source 102 may be tailored to provide a certain type of measurement (e.g., CD, overlay, tilt, edge roughness, or the like) and/or tailored to generate spatially-sensitive measurements of different length scales. For example, the illumination source 102 may be selected to provide an illumination beam 104 with a selected lateral coherence length, which may control an amount of shear that may be provided by the shearing element 112 (e.g., to ensure that the sheared beams 114 interfere). As an illustration, an illumination source 102 including a supercontinuum laser source may provide a relatively high lateral coherence to enable measurements of spatial variations on a wide range of length scales. A supercontinuum laser source may also beneficially provide a relatively high brightness, which may enable high signal to noise ratios and/or fast measurement times. As another example, in the case that the shearing element 112 is a diffraction grating, the pitch of the diffraction grating may be selected to provide a desired amount of shear. In a general sense, the amount of shear (and thus the pitch of the diffraction grating) may be selected based on the length scale of spatial variation of interest, where a length scale of spatial variation measured may generally scale with the shear provided by the shearing element 112.

Figure 7:
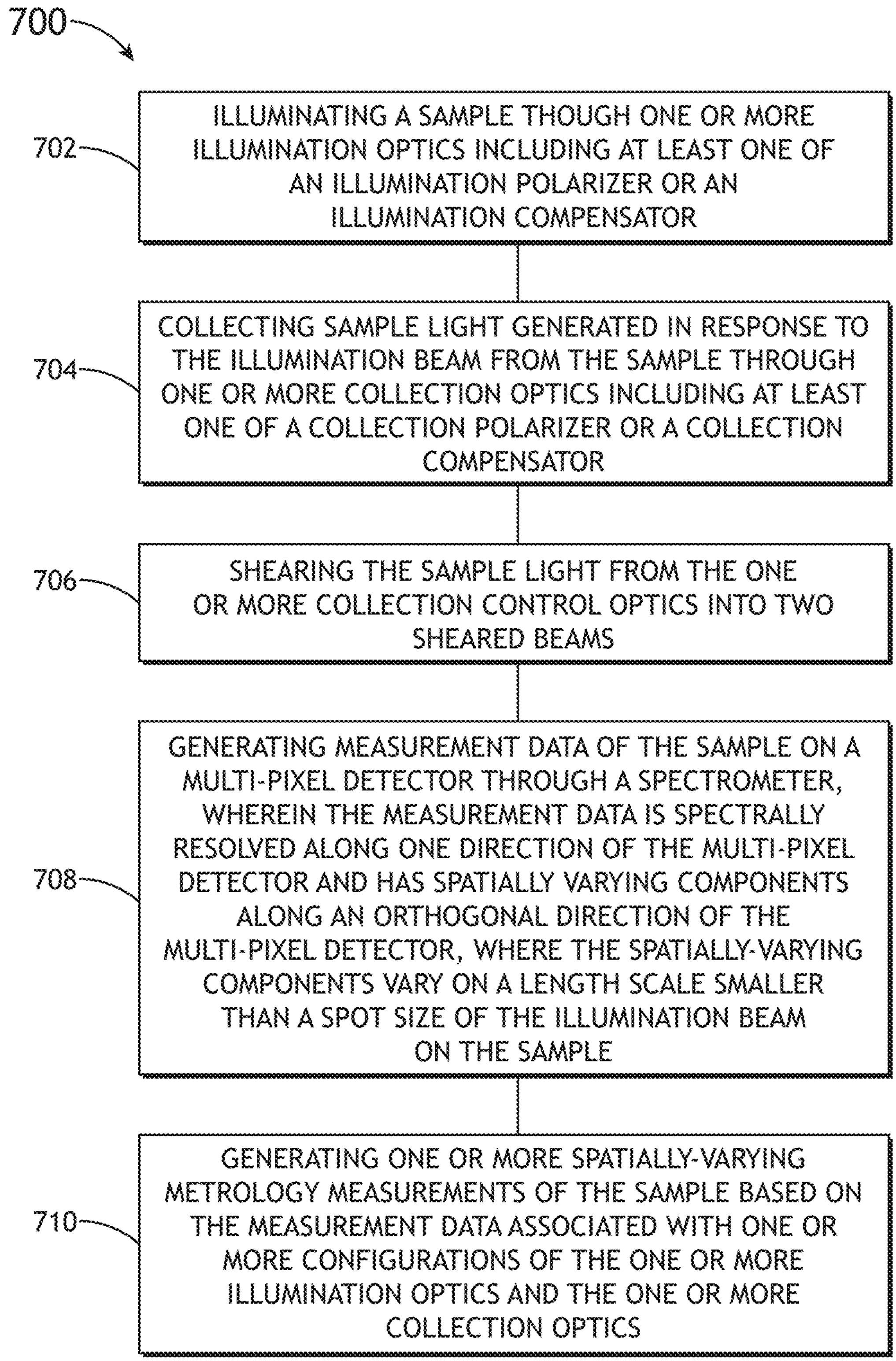
FIG. 7 is a flow diagram illustrating steps performed in a metrology method, in accordance with one or more embodiments of the present disclosure.

Referring now to FIG. 7, FIG. 7 is a flow diagram illustrating steps performed in a metrology method 700, in accordance with one or more embodiments of the present disclosure. The embodiments and enabling technologies described previously herein in the context of the metrology system 100 should be interpreted to extend to the method 700. For example, the various components of the metrology system 100 (e.g., the controller 124, the spectral metrology sub-system 106, the shearing element 112, the spectrometer 116, the multi-pixel detector 118, or the like) may implement one or more steps of the method 700. Further, the processors 126 of the controller 124 may execute program instructions causing the processors 126 to implement one or more steps of the method 700 either directly or indirectly through control signals to other components. It is further noted, however, that the method 700 is not limited to the architecture of the metrology system 100.

In some embodiments, the method 700 includes a step 702 of illuminating a sample 108 with an illumination beam 104 though one or more illumination optics 120 including at least one of an illumination polarizer or an illumination compensator. In some embodiments, the method 700 includes a step 704 of collecting sample light 110 generated in response to the illumination beam 104 from the sample 108 through one or more collection optics 122 including at least one of a collection polarizer or a collection compensator. For example, the illumination optics 120 and the collection optics 122 may form a spectral metrology tool such as, but not limited to a spectral ellipsometry tool or a spectral reflectometry tool.

In some embodiments, the method 700 includes a step 706 of shearing the sample light 110 from the one or more collection optics 122 into two sheared beams 114. The step 706 may be implemented with any type of shearing element 112 suitable for generating two sheared beams 114 such as, but not limited to, a diffraction grating.

In some embodiments, the method 700 includes a step 708 of generating measurement data of the sample on a multi-pixel detector 118 through a spectrometer 116, where the measurement data is spectrally resolved along one direction of the multi-pixel detector 118 and has spatially varying components along an orthogonal direction of the multi-pixel detector 118. Further, the spatially-varying components may vary on a length scale smaller than a spot size of the illumination beam 104 on the sample 108.

In some embodiments, the two sheared beams 114 are directed to an entrance slit of a spectrometer 116 to provide that the measurement data generated by the multi-pixel detector 118 is spectrally resolved along one direction and separated by LPD along an orthogonal direction.

In some embodiments, the method 700 includes imaging the sample 108 onto an entrance slit of the spectrometer 116, where the spectrometer 116 is configured as an imaging spectrometer. In this configuration, the multi-pixel detector 118 may be located at a field plane and the measurement data generated by the multi-pixel detector 118 may be both spatially and spectrally resolved.

In some embodiments, the method 700 includes a step 710 of generating one or more spatially-varying metrology measurements of the sample 108 based on the measurement data associated with one or more configurations of the one or more illumination optics 120 and the one or more illumination optics 120. For example, multiple sets of measurement data may be generated with different configurations of the illumination optics 120 and/or the collection optics 122 to provide measurement of any number of Mueller matrix elements associated with the sample 108. As another example, multiple sets of measurement data may be generated at multiple incidence angles (e.g., azimuth and/or polar incidence angles). In this way, the resulting spatially-varying metrology measurements may be generated based on any number of sets of measurement data associated with any configurations.

Further, the spatially-varying metrology measurements may include any type of measurement that may be determined based on the spatially-varying measurement data provided by the multi-pixel detector 118 such as, but not limited to, overlay, tilt, edge roughness, or CD measurements.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:

a light source configured to generate an illumination beam;

a spectral metrology sub-system configured to direct the illumination beam to a sample and collect sample light from the sample in response to the illumination beam, wherein the spectral metrology sub-system comprises:

one or more illumination optics comprising at least one of an illumination polarizer or an illumination compensator; and one or more collection optics comprising at least one of a collection polarizer or a collection compensator;

a shearing grating configured to shear the sample light from the one or more collection optics into two sheared beams;

a spectrometer configured to generate measurement data of the sample on a multi-pixel detector based on the two sheared beams, wherein the measurement data is spectrally resolved along one direction on the multi-pixel detector and has spatially varying components along an orthogonal direction on a length scale smaller than a spot size of the illumination beam on the sample; and a controller including one or more processors configured to execute program instructions causing the one or more processors to implement a metrology recipe by generating one or more spatially-varying metrology measurements of the sample based on the measurement data associated with one or more configurations of the spectral metrology sub-system.

2. The metrology system of claim 1, wherein the measurement data is spatially varying as a function of light path distance along the orthogonal direction of the multi-pixel detector.

3. The metrology system of claim 1, further comprising:

a lens to generate an image of the sample on an entrance slit of the spectrometer based on interfering the two sheared beams, wherein the measurement data is spatially resolved along the orthogonal direction of the multi-pixel detector.

4. The metrology system of claim 1, wherein the spectral metrology sub-system is a single-pass sub-system, wherein the sample light is associated with reflection of the illumination beam by the sample.

5. The metrology system of claim 1, wherein the spectral metrology sub-system is a multi-pass sub-system, wherein the spectral metrology sub-system further includes one or more mirrors configured to redirect the sample light to a common location of the sample for one or more repeated interactions prior to the one or more collection optics.

6. The metrology system of claim 5, wherein the one or more mirrors comprise:

a first mirror configured to reflect sample light associated with a first interaction of the illumination beam with the common location of the sample to a modulating target as the first interaction; and a second mirror configured to reflect light from the modulating target to the common location of the sample as a second interaction, wherein the one or more collection optics receive the sample light from the common location of the sample associated with the second interaction.

7. The metrology system of claim 1, wherein the spectral metrology sub-system is a multi-pass sub-system, wherein the spectral metrology sub-system further includes one or more mirrors configured to redirect the sample light to a series of locations on the sample prior to the one or more collection optics.

8. The metrology system of claim 7, wherein the series of locations on the sample have features of a common design.

9. The metrology system of claim 1, wherein the one or more configurations of the spectral metrology sub-system comprise:

one or more rotational positions of elements in at least one of the one or more illumination optics or the one or more collection optics.

10. The metrology system of claim 1, wherein the one or more configurations of the spectral metrology sub-system comprise:

one or more incidence angles of the illumination beam on the sample.

11. The metrology system of claim 10, wherein the one or more incidence angles comprise:

at least one of one or more azimuth incidence angles or one or more polar incidence angles.

12. The metrology system of claim 1, wherein the spectral metrology sub-system operates as a spectral ellipsometry system.

13. The metrology system of claim 1, wherein the spectral metrology sub-system operates as a spectral reflectometry system.

14. The metrology system of claim 1, wherein the one or more spatially-varying metrology measurements comprise:

at least one of an overlay measurement, a tilt measurement, a critical dimension measurement, or an edge roughness measurement.

15. The metrology system of claim 1, wherein the one or more spatially-varying metrology measurements comprise:

two or more spatially-varying metrology measurements.

16. The metrology system of claim 15, wherein the two or more spatially-varying metrology measurements comprise:

at least a critical dimension measurement and an edge roughness measurement.

17. A metrology method comprising:

illuminating a sample with an illumination beam though one or more illumination optics including at least one of an illumination polarizer or an illumination compensator;

collecting sample light generated in response to the illumination beam from the sample through one or more collection optics including at least one of a collection polarizer or a collection compensator;

shearing the sample light from the one or more collection optics into two sheared beams;

generating measurement data of the sample on a multi-pixel detector through a spectrometer, wherein the measurement data is spectrally resolved along one direction of the multi-pixel detector and has spatially varying components along an orthogonal direction of the multi-pixel detector, wherein the spatially varying components vary on a length scale smaller than a spot size of the illumination beam on the sample; and generating one or more spatially-varying metrology measurements of the sample based on the measurement data associated with one or more configurations of the one or more illumination optics and the one or more collection optics.

18. The metrology method of claim 17, wherein the measurement data is spatially varying as a function of light path distance (LPD) along the orthogonal direction of the multi-pixel detector.

19. The metrology method of claim 17, further comprising:

imaging of the sample on an entrance slit of the spectrometer with a lens based on interfering the two sheared beams, wherein the measurement data is spatially resolved along the orthogonal direction of the multi-pixel detector.

20. A metrology system comprising:

a controller including one or more processors configured to execute program instructions causing the one or more processors to implement a metrology recipe by:

receiving measurement data of a sample associated with one or more configurations of a spectral metrology sub-system, wherein the measurement data is generated by:

illuminating the sample with an illumination beam though one or more illumination optics including at least one of an illumination polarizer or an illumination compensator;

collecting sample light generated in response to the illumination beam from the sample through one or more collection optics including at least one of a collection polarizer or a collection compensator;

shearing the sample light from the one or more collection optics into two sheared beams; and generating measurement data of the sample on a multi-pixel detector through a spectrometer, wherein the measurement data is spectrally resolved along a first direction on the multi-pixel detector and has spatially varying components along a second, orthogonal direction on a length scale smaller than a spot size of the illumination beam on the sample; and generating one or more spatially-varying metrology measurements of the sample based on the measurement data associated with the one or more configurations of the spectral metrology sub-system.

21. The metrology system of claim 20, wherein the measurement data is spatially varying as a function of light path distance.

22. The metrology system of claim 20, further comprising:

a lens to generate an image of the sample on an entrance slit of the spectrometer based on interfering the two sheared beams, wherein the measurement data is spatially resolved.

23. The metrology system of claim 20, wherein the one or more spatially-varying metrology measurements comprise:

at least one of an overlay measurement, a tilt measurement, a critical dimension measurement, or an edge roughness measurement.

24. The metrology system of claim 20, wherein the one or more spatially-varying metrology measurements comprise:

two or more spatially-varying metrology measurements.

25. The metrology system of claim 24, wherein the two or more spatially-varying metrology measurements comprise:

at least a critical dimension measurement and an edge roughness measurement.

* * * * *